(12) United States Patent
Hayakawa

(10) Patent No.: US 7,615,473 B2
(45) Date of Patent: Nov. 10, 2009

(54) METHOD OF INTRODUCING ION AND METHOD OF MANUFACTURING SEMICONDUCTOR DEVICE

(75) Inventor: Shigenori Hayakawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/345,401

(22) Filed: Jan. 16, 2003

(65) Prior Publication Data

US 2003/0232465 A1    Dec. 18, 2003

(30) Foreign Application Priority Data

Jan. 17, 2002    (JP)    ............... 2002-009292

(51) Int. Cl.
*H01L 21/08*    (2006.01)
(52) U.S. Cl. .................. 438/514; 438/781; 438/517
(58) Field of Classification Search ......... 438/510–530, 438/781, 795–799; 427/525, 526, 531–534; 430/270.1; 250/492.21
See application file for complete search history.

(56) References Cited

U.S. PATENT DOCUMENTS

| | | | |
|---|---|---|---|
| 4,851,691 A | | 7/1989 | Hanley |
| 5,660,957 A | * | 8/1997 | Chou et al. .................. 430/5 |
| 5,858,623 A | * | 1/1999 | Yu et al. .................. 430/315 |
| 5,892,235 A | | 4/1999 | Yamazaki et al. |
| 6,335,942 B1 | | 1/2002 | Huang et al. |
| 6,458,430 B1 | | 10/2002 | Bernstein et al. |

(Continued)

FOREIGN PATENT DOCUMENTS

EP    1 003 223    5/2000

(Continued)

OTHER PUBLICATIONS

J. Chen et al., *Electron Density and Energy Distributions in the Positive DC Corona: Interpretation for Corona-Enhanced Chemical Reaction*, Plasma Chemistry and Plasma Processing, vol. 22, No. 2, pp. 199-224, Jun. 2002.

*Primary Examiner*—Savitri Mulpuri
(74) *Attorney, Agent, or Firm*—Eric J. Robinson; Robinson Intellectual Property Law Office, P.C.

(57) ABSTRACT

When an ion is introduced into a semiconductor on which a resist is formed, the ion and the resist react with each other to generate a gas (dissociated gas) and a component of the thus-generated dissociated gas is introduced into the semiconductor, which becomes a factor to deteriorate properties of the semiconductor. According to the invention, the dissociated gas to be generated from an organic film is treated. Particularly, the dissociated gas is treated before an ion introduction is performed. As a method of performing such a treatment, the ion introduction is performed by dividing ion introduction processing itself into a plurality of times. The dissociated gas is generated in a maximum quantity just after the ion introduction is started. For this reason, it is possible to decrease an introduction of a component of the dissociated gas into the semiconductor or prevent the component of the dissociated gas from being introduced into the semiconductor, when ion introduction processing is divided into a plurality of times and, in each of the thus-divided ion introduction processing after a second time thereof, the ion is introduced while removing the dissociated gas from a treatment chamber by performing evacuation.

4 Claims, 15 Drawing Sheets

U.S. PATENT DOCUMENTS

| | | |
|---|---|---|
| 6,459,124 B1 | 10/2002 | Zhang et al. |
| 6,528,360 B2 | 3/2003 | Zhang et al. |
| 6,815,311 B2 * | 11/2004 | Hong et al. ............ 438/433 |
| 6,909,114 B1 | 6/2005 | Yamazaki |
| 2002/0056844 A1 | 5/2002 | Yamazaki et al. |
| 2005/0104068 A1 | 5/2005 | Yamazaki |
| 2005/0110016 A1 | 5/2005 | Yamazaki |
| 2006/0051906 A1 | 3/2006 | Yamazaki |

FOREIGN PATENT DOCUMENTS

| | | |
|---|---|---|
| JP | 59-101826 | 6/1984 |
| JP | 62-219920 | 9/1987 |
| JP | 04-186737 | 7/1992 |
| JP | 05-055159 | 3/1993 |
| JP | 10-106967 A | 4/1998 |
| JP | 2001-094113 | 4/2001 |
| JP | 2001-267266 | 9/2001 |
| JP | 2001-274087 | 10/2001 |

* cited by examiner

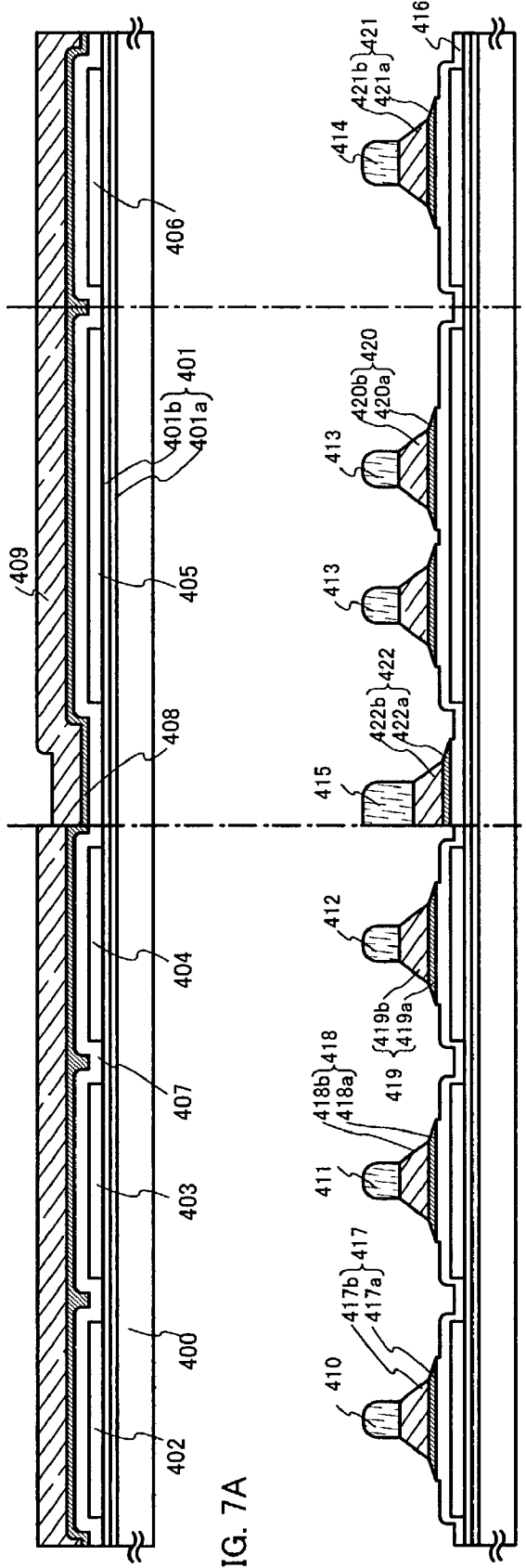
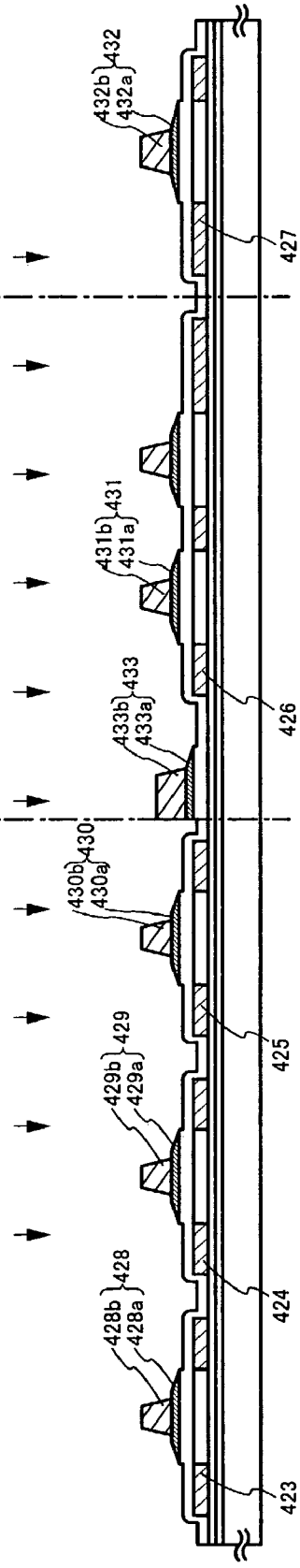
FIG. 7A
FIG. 7B
FIG. 7C

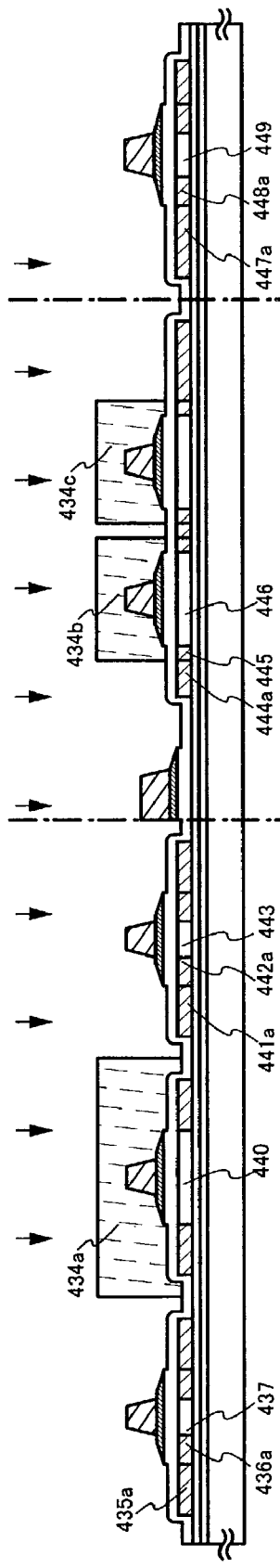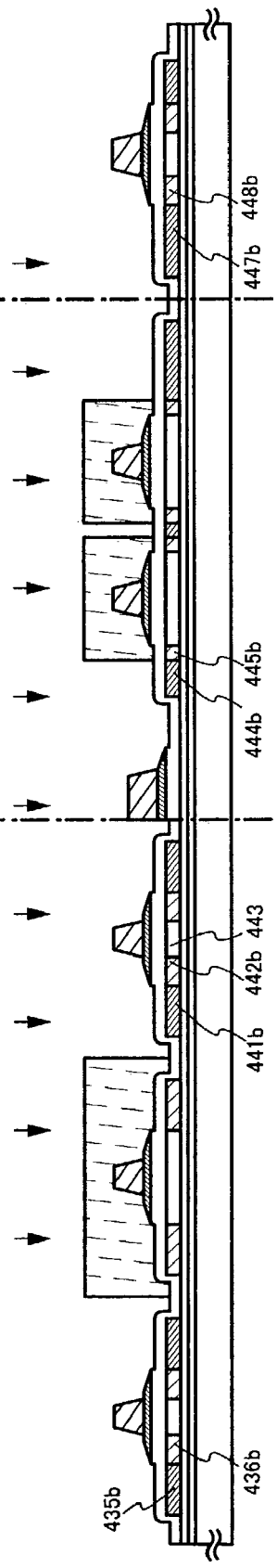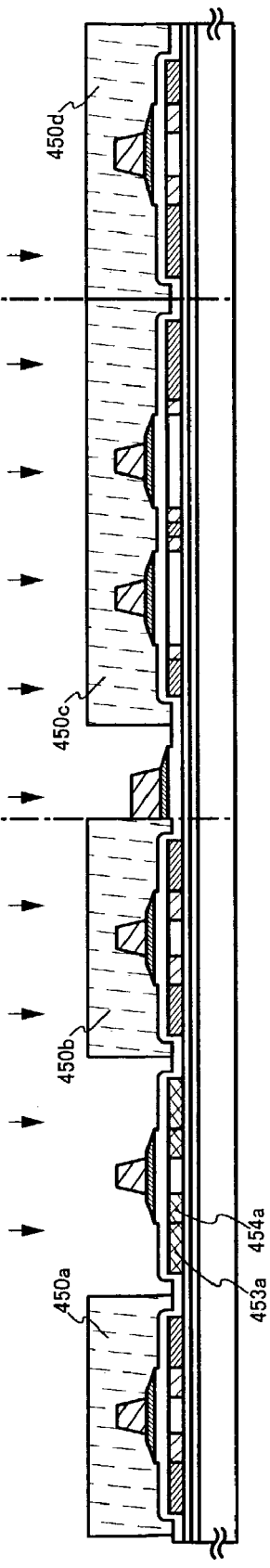
FIG. 8A
FIG. 8B
FIG. 8C

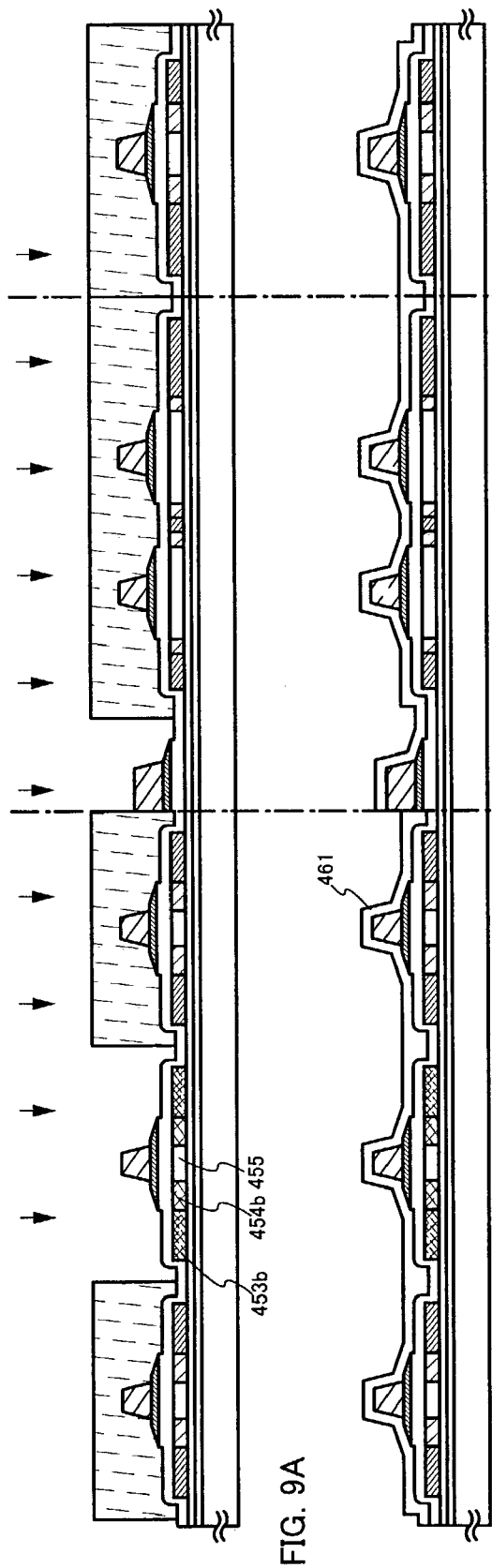
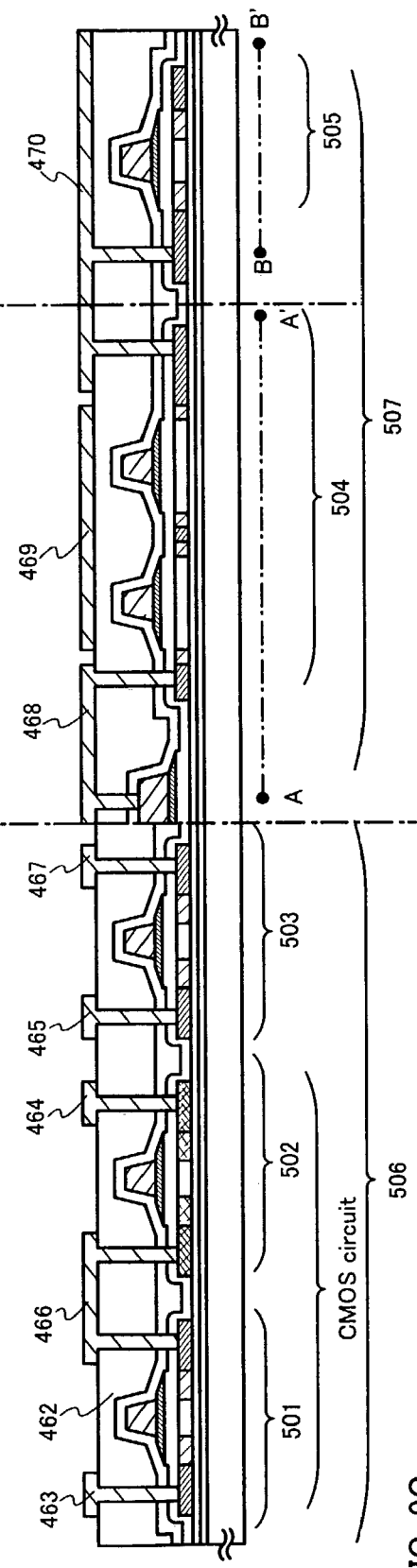

METHOD OF INTRODUCING ION AND METHOD OF MANUFACTURING SEMICONDUCTOR DEVICE

BACKGROUND OF THE INVENTION

1. Field of the Invention

The present invention relates to a method of introducing an ion. Further, the present invention also relates to a method of manufacturing a semiconductor device which is manufactured by a step comprising introducing an ion. As used herein, the term "semiconductor device" is intended to include all devices which can exert functions thereof by making use of semiconductor characteristics. It is construed that the term "semiconductor device" is further intended to include in the category thereof other devices, such as a liquid crystal display device in which a thin film transistor and liquid crystal are combined with each other, and a light emitting device in which a thin film transistor and a light emitting element are combined with each other.

2. Description of the Related Art

A technique for manufacturing a circuit having a predetermined function by first forming an element such as a thin film transistor on a surface of a semiconductor and then connecting it by wiring has been well known. In this technique, an ion-introducing technique for forming an impurity region having a conductivity type of n type or p type in a predetermined region has become essential.

As the ion-introducing technique, a technique in which a plurality of ions which differ in mass from one another are generated by converting a material gas into a plasma state by a trigger electrode and, then, the thus-generated ions in the plasma are imparted with an appropriate energy by a drawing electrode system or an acceleration electrode system arranged in a chamber and, thereafter, the ions thus imparted with the energy are introduced into a semiconductor has been known. Further, there is a case in which, after the material gas is changed into a plasma state to generate ions, only ions selected thereamong by a mass separation method are introduced in the semiconductor. Characteristics of the ion-introducing technique are in that it is possible to implant an impurity element having a predetermined concentration into a predetermined depth in the semiconductor by controlling an acceleration voltage or an ion density. Examples of illustrative apparatuses to be adopted in this occasion include an ion-doping apparatus, and an ion-implanting apparatus.

Further, there is another case in which an ion is introduced only in a desired region in a semiconductor. For example, a resist comprising an organic film is partially formed on the semiconductor and, then, the ion is introduced while using the thus-formed resist as a mask to allow the ion to be introduced only in a region on which the resist is not formed.

However, when the resist is formed on the semiconductor, the ion is introduced also in the resist. Therefore, the ion imparted with energy is allowed to react with a component of the resist to generate a gas, which is herein referred to as a "dissociated gas". Since the resist is ordinarily an organic film, components of the dissociated gas comprise nitrogen, carbon, oxygen, hydrogen, and water vapor. When the dissociated gas is generated, a component of the dissociated gas is implanted in the semiconductor together with the ion imparted with energy. FIG. 6 shows distributions of boron (B), carbon (C), oxygen (O) and nitrogen (N) in a silicon wafer at the time boron is introduced into each of the silicon wafer on which a resist is formed (shown in a heavy line) and the silicon wafer on which the resist is not formed (shown in a thin line). The ion was introduced under the following conditions: a material gas was $B_2H_6$; a radio frequency supply was 20 W; an acceleration voltage was 65 kV; and a dose rate was $3.3\times10^{15}$ atoms/cm$^2$. It can be seen from FIG. 6 that carbon (C), oxygen (O), and nitrogen (N) are distributed in a greater extent in the silicon wafer on which the resist is formed than in the silicon wafer on which the resist is not formed. In order to enhance properties of the semiconductor, it is desirable to allow such distributions to be smaller by even a small extent.

Further, since the resist is partially formed on the semiconductor, the dissociated gas is locally generated to cause a quantity of ion to be introduced in the semiconductor to be unevenly distributed. Furthermore, since pressure inside a treatment chamber in which the introduction of the ion is performed varies due to the generation of the dissociated gas, arcing may sometimes appear, or an ion density or an acceleration voltage is adversely affected to allow the ion introduction conditions to depart from the set ion introduction conditions. This is a serious problem in a recent trend in which a size of a substrate is being enlarged and also becomes a major factor of deteriorating semiconductor properties.

Then, as a method for decreasing the generation of the dissociated gas, there is a method of performing baking processing or a UV irradiation before the ion is introduced. By this method, the resist is cured to thereby decrease the generation of the dissociated gas. On the other hand, since the resist is employed merely as a mask for the purpose of allowing the ion to be introduced only in a desired region, it is necessary to remove the resist after the ion is introduced. However, it is sometimes difficult to completely remove the resist which has been cured by the baking processing or the UV irradiation even with ashing, peeling, or other appropriate processing. Since the resist is ordinarily an organic film, when the resist remains on the semiconductor as a residue, an apparatus to be used in a subsequent step in the introduction of the ion is contaminated whereupon such contamination will cause deterioration of not only properties of the semiconductor of interest but also properties of other semiconductors and will, then, give a detrimental effect on operating characteristics of the semiconductor device. Further, such contamination will deteriorate a coating property of a film to be formed after the ion is introduced whereupon such deterioration may cause a malfunction such as wire breakage. Furthermore, performing the baking processing or the UV irradiation increases a number of processing steps to thereby cause an increase of an overall processing time or cost.

SUMMARY OF THE INVENTION

Under these circumstances, the present invention provides a method of decreasing or preventing a generation of a dissociated gas from an organic film which is represented by a resist. Further, an object of the invention is to provide a method of decreasing or preventing the generation of the dissociated gas at the time an ion is introduced into a desired region by using the organic film. Furthermore, another object of the invention is to provide a method of manufacturing a semiconductor device which is manufactured by the steps comprising an introduction of an ion.

According to the invention, the dissociated gas to be generated from the organic film is treated. Particularly, according to the invention, the dissociated gas is treated before the introduction of the ion is performed. As a method of performing such treatment, the introduction of the ion is performed by dividing such ion introduction processing itself into a plurality of times. The dissociated gas is generated in a greatest extent just after the introduction of the ion is started. For this reason, the introduction of the ion is divided into a plurality of times and, when the ion is introduced while the generated dissociated gas is removed from a treatment chamber by performing evacuation processing every time the introduction of the ion of at least a second time or thereafter is performed, it becomes possible to decrease or prevent the introduction of the component of the dissociated gas into the semiconductor. It goes without saying that such discharge may be performed from the time the ion is first is introduced or the discharge may be performed every time after the introduction of the ion is completed to thereby decrease or remove the dissociated gas from the treatment chamber.

In ion introduction processing, an apparatus such as an ion-doping apparatus or an ion implantation apparatus may be used. For example, known ion doping apparatuses and known ion implantation apparatuses disclosed in U.S. Pat. No. 5,892,235 issued to Yamazaki et al. may be used. The entire disclosure of this patent is incorporated herein by reference.

Further, the method according to the invention can be applied to the resist which has been cured by subjecting it to baking processing, a UV irradiation or other appropriate processing. Even when the introduction of the ion is performed after the baking processing or the UV irradiation is performed, the dissociated gas is generated in many cases. Therefore, it is highly effective to adopt the method according to the invention.

Thus, according to a first aspect of the invention, there is provided a method of introducing an ion, comprising the step of: treating a dissociated gas to be generated in an organic film.

Also, according to a second aspect of the invention, there is provided a method of introducing an ion, comprising the steps of: treating a dissociated gas to be generated from an organic film by performing an introduction of a first ion by a first acceleration voltage or a first electric current density while using the organic film as a mask; and performing an introduction of a second ion by a second acceleration voltage or a second electric current density while using the organic film as a mask.

In the above-described method, it is desirable that the first acceleration voltage is higher than the second acceleration voltage. In this manner, the generation of the dissociated gas at the time of the introduction of the second ion can be decreased or prevented. Further, it is desirable that the first electric current density is lower than the second electric current density. In this manner, the introduction of a component of the dissociated gas into a semiconductor can be decreased or prevented.

Further, in the above-described method, it is desirable that the first ion and the second ion are generated by using a same material gas. This is mainly because that, when the ion is introduced by using a different material gas in a same apparatus, conditions such as the pressure inside the treatment chamber are apt to be unstable at the time the introduction of the second ion is performed whereupon there is a case in which such introduction processing is performed under such conditions as departed from the set conditions. However, when an ion to be generated by using an inert gas is used as the first ion and an ion to be generated by using a material gas is used as the second ion, the introduction of the ions can be performed in a more stable manner than in a case of using different material gases from each other when the first ion and the second ion are generated.

Further, as the material gas, a material gas to be used for imparting an n type ($PH_3$ as a representative example) or another material gas to be used for imparting a p type ($B_2H_6$ as a representative example) can be employed.

In the above-described method, a time period of introducing the first ion into the semiconductor on which the resist is formed by the first acceleration voltage is within 6 minutes, and preferably within 2 minutes. The introduction of the first ion is performed for curing the resist to some extent and for allowing the generation of the dissociated gas to be prevented or decreased at the time the second ion is introduced into the semiconductor. When the time period of the introduction of the first ion is unduly long, a component of the dissociated gas is also introduced into the semiconductor to deteriorate properties of the semiconductor or to make it difficult to remove the resist after the introduction of the ion is terminated due to a fact that the resist is cured up to an unnecessary extent.

According to another aspect of the present invention, there is provided a method of manufacturing a semiconductor device described herein which comprises forming an impurity region by performing an introduction of an ion after a dissociated gas from an organic film which is formed on a semiconductor film is treated.

According to still another aspect of the present invention, there is provided a method of manufacturing a semiconductor device described herein which comprises the steps of treating a dissociated gas from an organic film which is formed on a semiconductor film by performing an introduction of a first ion by a first acceleration voltage or a first electric current density while using the organic film as a mask; and forming an impurity region by performing an introduction of a second ion by a second acceleration voltage or a second electric current density while using the organic film as a mask.

In the above-described method, it is desirable that the first acceleration voltage is higher than the second acceleration voltage. Further, it is desirable that the first electric current density is lower than the second electric current density.

Further, in the above-described method, it is preferable that the first ion and the second ion are generated by using a same material gas. However, so far as an ion generated by using an inert gas as the first ion and another ion generated by using a material gas is used as the second ion, the introduction of the ions can be performed in a more stable manner than in a case of using different material gases from each other in the first ion and the second ion.

Furthermore, as the material gas, a material gas to be used for imparting an n type ($PH_3$ as a representative example) or another material gas to be used for imparting a p type ($B_2H_6$ as a representative example) can be employed.

Still further, in the above-described method, it is desirable that a time period of introducing the first ion into the semiconductor on which the resist is formed by the first acceleration voltage is within 6 minutes, and preferably within 2 minutes.

In the above-described method, it is desirable that a silicon film is used as the semiconductor. Further, compound semiconductor films each having an amorphous structure such as an amorphous silicon film, as well as an amorphous silicon germanium film may be applied. Further, as substrates for forming the semiconductor, for example, a glass substrate, a quartz substrate, a silicon substrate, a plastic substrate, a metal substrate, a stainless-steel substrate, and a flexible substrate can be used. Examples of the glass substrates include substrates made of glasses such as a barium borosilicate glass and an alumino-borosilicate glass. Further, examples of the flexible substrates include substrates each in a film state made of PET, PES, PEN, and an acrylic resin. When the semiconductor device is manufactured by using the flexible substrate, manufacturing of the device having a lighter weight can be aimed. It is desirable that, when a barrier layer such as an aluminum film (such as AlON, AlN, or AlO), an carbon film (such as DLC (diamond-like carbon)) or SiN is formed on a front surface, or a front surface and a rear surface of the flexible substrate in a single layer or multi-layer manner, durability is enhanced.

As described above, according to the invention, by performing the introduction of the ion by dividing the introduction processing itself into a plurality of times, it becomes possible to decrease or prevent the introduction of a component of the dissociated gas into the semiconductor. Further, the introduction of the ion into the semiconductor can be performed without departing from the set conditions and in a uniform manner. Still further, since baking processing is not performed on the resist before the ion is introduced, a number of processing steps is not increased and, also, it becomes possible to easily perform a removal of the resist which is to be conducted after the ion is introduced. These features are highly effective factors in a recent trend in which the size of the substrate is being enlarged.

By applying the method according to the invention, in a semiconductor device, which is represented by an active matrix-type liquid crystal display device, enhancements of operational characteristics and reliability of the semiconductor device can be achieved. Still further, lowering a production cost of the semiconductor device can be achieved.

BRIEF DESCRIPTION OF THE DRAWINGS

FIGS. 7A to 7C are cross-sectional views of a process of manufacturing a pixel TFT, and a TFT of a drive circuit;

FIGS. 8A to 8C are cross-sectional views of another process of manufacturing a pixel TFT, and a TFT of a drive circuit;

FIGS. 9A to 9C are cross-sectional views of still another process of manufacturing a pixel TFT, and a TFT of a drive circuit;

DETAILED DESCRIPTION OF THE INVENTION

EXAMPLE 1

Embodiments according to the present invention are described in detail with reference to FIGS. 1A to 1C.

Figure 1A:
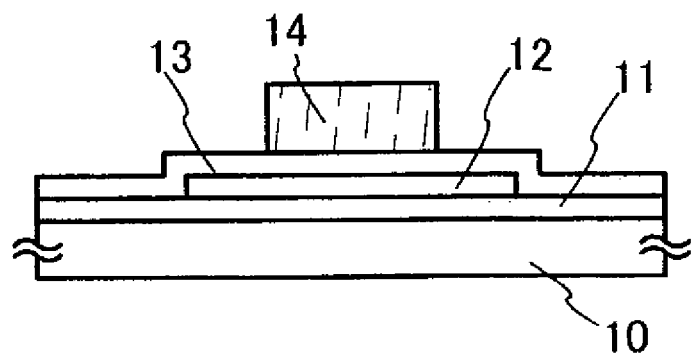
FIGS. 1A to 1C are schematic diagrams showing an example of a method of introducing an ion according to the present invention.
Figure 1B:
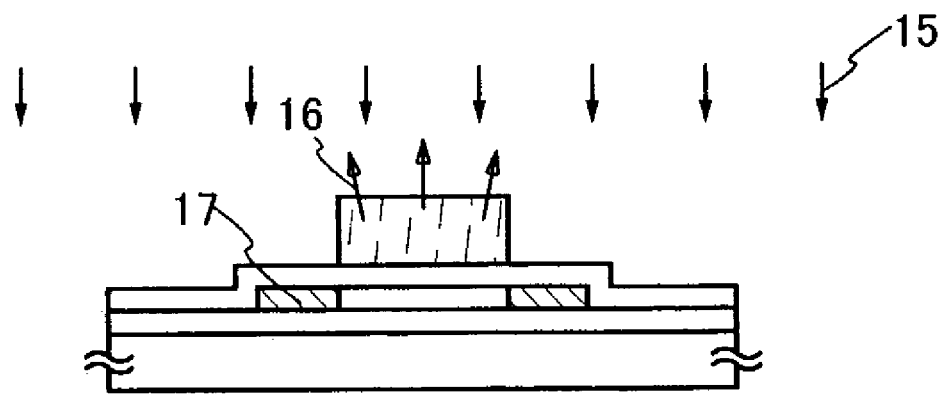

FIG. 1A shows an example of a semiconductor on which a resist is partially formed. An underlying insulating film 11 is formed on a substrate 10 and, then, a semiconductor film 12 is formed on the thus-formed underlying insulating film 11 and, thereafter, a resist 14 is formed on the thus-formed semiconductor film 12 via an insulating film 13. It goes without saying that the resist 14 may be formed on the semiconductor film 12 without forming the insulating film 13 therebetween.

A first introduction of a first ion 15 into the semiconductor on which the resist 14 is thus formed is performed by a first acceleration voltage. In such first introduction processing, an apparatus such as an ion-doping apparatus or an ion implantation apparatus may be used and, also, a known material gas (for example, $PH_3$, $B_2H_6$) may be used as a material gas. Further, an inert gas which will not affect the semiconductor may be used. Furthermore, it is desirable that the first acceleration voltage is higher than a second acceleration voltage which is applied in a subsequent step. Still further, it is desirable that the first introduction is performed within a period of 6 minutes (preferably 2 minutes). By the first introduction, the first ion 15 is allowed to react with the resist 14 to generate a dissociated gas 16.

It is desirable that, subsequently, an inside of a treatment chamber is evacuated. This is performed for the purpose of removing the dissociated gas 16 generated by the first introduction from the inside of the treatment chamber (see FIG. 1B). Ordinarily, the introduction of the ion is performed while the material gas is supplied into the treatment chamber on one hand and the inside of the treatment chamber is evacuated on the other hand. However, there are many cases in which the evacuation at the time of the introduction of the ion is conducted by utilizing from 10 to 90 percent of an entire evacuation capacity. Therefore, in order to remove the dissociated gas generated in the treatment chamber as much as possible, it is desirable that the evacuation of the inside of the treatment chamber is performed between the introductions of the first ion and the second ion. However, when an apparatus having a high evacuation capacity is used, it is not always necessary that the evacuation of the inside of the treatment chamber is performed between the introductions of the first ion and the second ion.

Figure 1C:
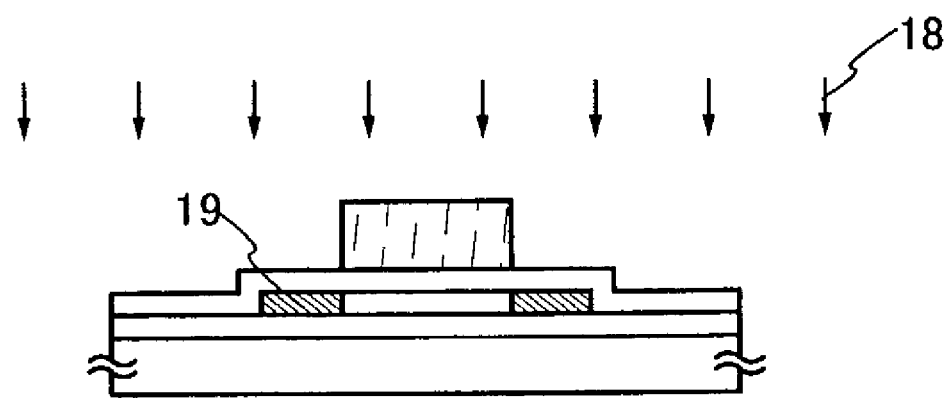

Then, a second introduction of the second ion 18 is performed by the second acceleration voltage (see FIG. 1C). Even in such second introduction processing, an apparatus such as an ion-doping apparatus or an ion implantation apparatus may be used in a same manner as in the first introduction of the first ion. It is desirable that a same material gas as in the first introduction is used. This is mainly because that, when different gases are used in the first and second introductions, the pressure inside the treatment chamber becomes unstable and, as a result, there is a possibility to give a detrimental effect to the second introduction processing. Needless to say, when the inert gas is used at the time of the first introduction, the processing can consistently be performed with little problem. Further, the second acceleration voltage or a second processing period of time may appropriately be determined by a person who performs the processing, for example, so as to be suitable for manufacturing the semiconductor device.

As described above, by performing the introduction of the ion while dividing the ion introduction processing itself into a plurality of times, it becomes possible to decrease or prevent the introduction of a component of the dissociated gas into the semiconductor and, also, it becomes possible to introduce the ion into the semiconductor in a uniform manner without departing from the set conditions. Further, since baking processing is not performed on the resist before the ion is introduced, a number of processing steps is not increased and, also, it becomes possible to easily perform a removal of the resist which is to be conducted after the ion is introduced. These features are highly effective factors in a recent trend in which the size of the substrate is being enlarged.

In the present Example, although the introduction of the ion was performed while dividing the introduction processing itself by two times, the number of the introduction is not limited to two times so long as it is a plurality of times.

Further, in the Example, although baking processing had not been performed on the resist before the ion was introduced, the method according to the present invention can also be applied after the baking processing is performed.

Furthermore, in the Example, although a method of decreasing or preventing the dissociated gas to be generated from the resist at the time of introduction of the ion has been described, it is also possible to apply the method according to the invention for decreasing or preventing the dissociated gas to be generated from other organic films made of, such as an acrylic resin and polyimide.

EXAMPLE 2

In the present Example, described is a result obtained by observing changes of pressure inside a treatment chamber when a resist was formed on a substrate and, then, a first introduction of an ion and a second introduction of an ion were performed. Further, in the Example, an experiment was conducted while a condition of a first acceleration voltage was fluctuated at the time of the first introduction.

Figure 2A:
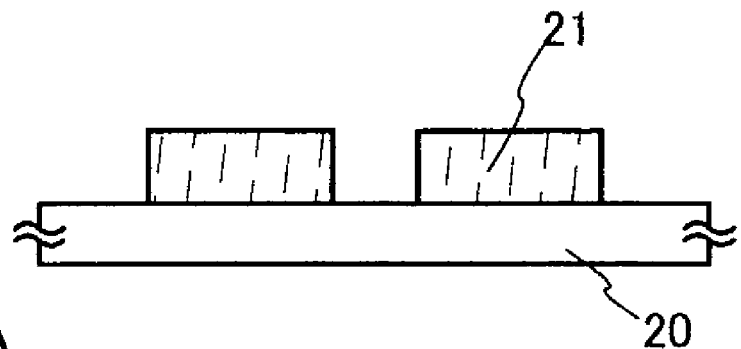
FIGS. 2A to 2C are schematic diagrams showing another example of a method of introducing an ion according to the present invention.
Figure 2B:
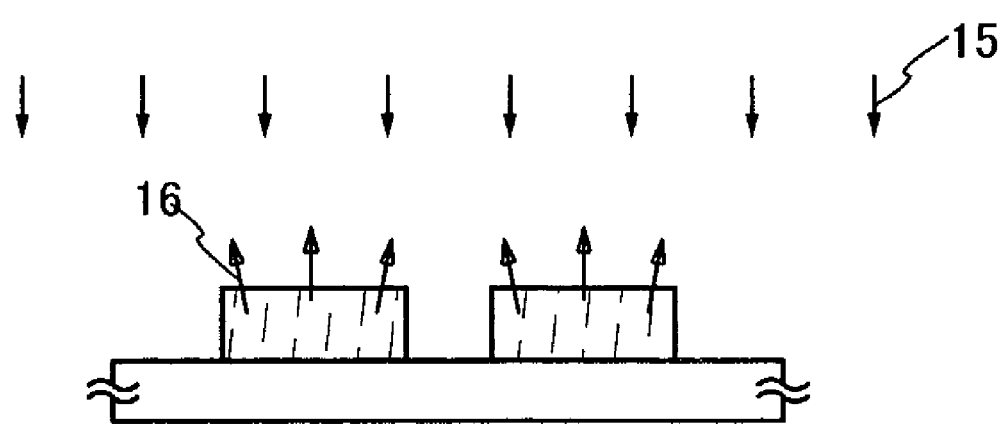
Figure 2C:
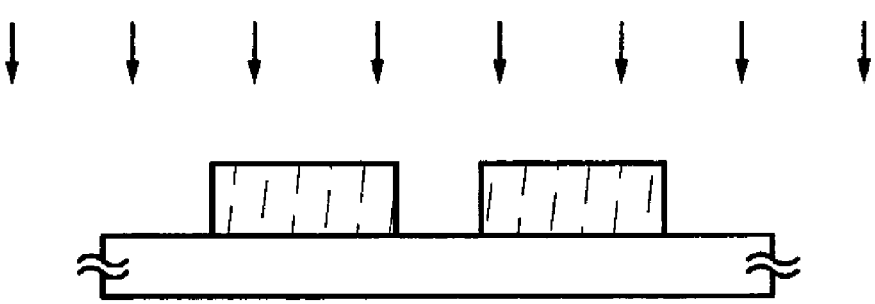

FIGS. 2A to 2C show an example in which a resist 21 is partially formed on a substrate 20. In this example, a glass substrate was used as the substrate 20 and a novolac resin was used as the resist 21.

Figure 3A:
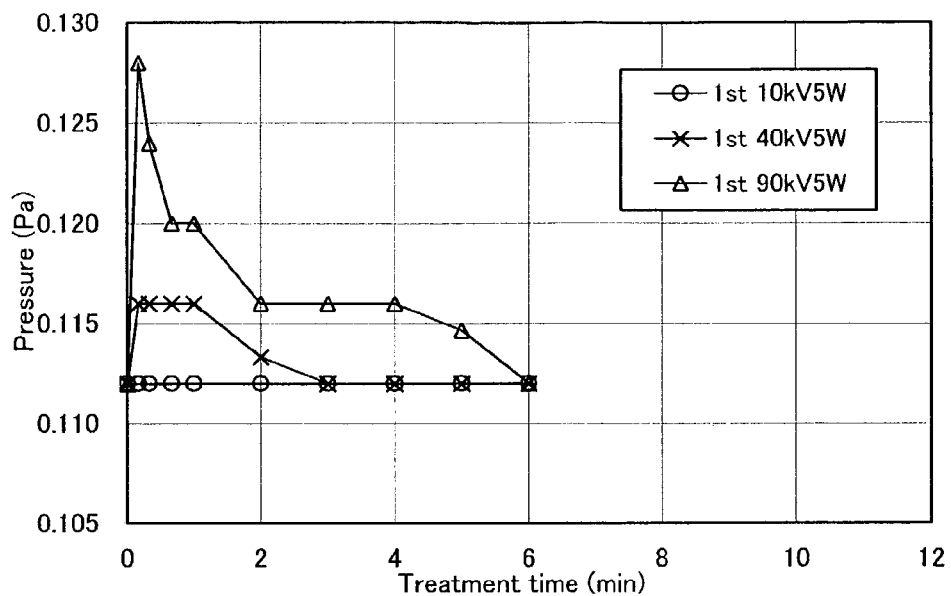
FIGS. 3A and 3B are graphs showing an example of change of pressure in a treatment chamber when a first acceleration voltage is fluctuated while keeping a second acceleration voltage under a same condition.

A first introduction of the ion was performed into the substrate on which the resist 21 was thus formed. Such introduction processing was performed for 6 minutes by using an ion doping apparatus and $B_2H_6$ as a material gas. Further, 3 types of acceleration voltages, that is, 10 kV, 40 kV, and 90 kV, were adopted. Changes of the pressure inside the treatment chamber under the above-described conditions are shown in FIG. 3A. Since the material gas was introduced into the treatment chamber on one hand and evacuation of an inside of the chamber was conducted on the other hand while the ion is introduced, the pressure inside the treatment chamber should be kept at a steady value. However, when a dissociated gas 16 is generated, since a quantity of the gas to be discharged exceeds capacity of an apparatus for evacuation of the inside of the treatment chamber, the pressure inside the treatment chamber is increased and, when such generation of the dissociated gas was terminated, the pressure inside the treatment chamber is back to be at a steady value. It can be seen from FIG. 3A that, as the acceleration voltage becomes higher, the dissociated gas is generated more. It can further be seen that, since the pressure comes to be at a steady value as the time passes, the dissociated gas is less generated as the time passes.

Subsequently, evacuation of the inside of the treatment chamber is conducted to remove the dissociated gas 16 from the treatment chamber or decrease the dissociated gas 16 inside the treatment chamber (see FIG. 2B).

Figure 3B:
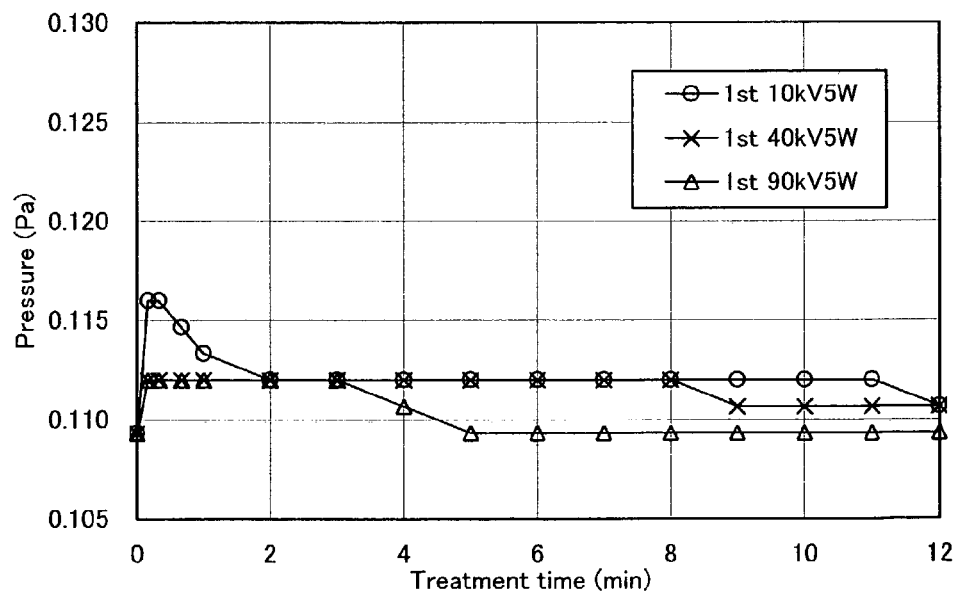

Thereafter, a second introduction of the ion is conducted by a second acceleration voltage on each of the substrates on which the first introduction was performed (see FIG. 2C). Also in such second introduction processing, an ion doping apparatus was used as in the first introduction processing of the ion. As far as the material gas is concerned, $B_2H_6$ was used in a same manner as in the first introduction. The acceleration voltage was allowed to be 30 kV. The change of the pressure inside the treatment chamber at this occasion is shown in FIG. 3B. It can be seen from FIG. 3B that, when the acceleration voltage at the time of the first introduction is high, there is little change of the pressure at the time of the second introduction, that is, there is little generation of the dissociated gas.

Under these circumstances, it can be seen, according to the invention, that the first acceleration voltage is desirably higher than the second acceleration voltage. Further, as a time period of the first introduction processing is longer, an adverse effect such as a component of the dissociated gas is introduced into the semiconductor is generated more. For this reason, the processing time may be about 2 minutes, and preferably within a minute. In another case, when the first acceleration voltage is 90 kV, the pressure inside the treatment chamber takes a peak value 10 seconds after the first introduction is conducted and keeps the same value 40 seconds and one minute thereafter whereupon it is permissible that the processing time is within either 40 seconds or 10 seconds. However, a period of from the time the pressure takes a peak value to the time the pressure takes a stable value varies depending on the conditions of, for example, the acceleration voltage whereupon it is preferable to previously check peak values corresponding to various types of conditions and determine respective times to reach the stable value.

By performing the ion introduction by dividing the introduction processing itself into a plurality of times in the manner as described above, it becomes possible to decrease or prevent the introduction of a component of the dissociated gas into the semiconductor. Further, the processing can be performed without departing from the set introduction conditions and the ion can be introduced into the semiconductor in a uniform manner. Furthermore, since baking processing is not performed on the resist before the ion is introduced, a number of processing steps is not increased and, also, it becomes possible to easily perform a removal of the resist which is to be conducted after the ion is introduced.

In the present Example, although the introduction of the ion was performed while dividing the introduction processing itself by two times, the number of the introduction is not limited to two times so long as it is a plurality of times.

EXAMPLE 3

In the present Example, described is a result obtained by observing changes of pressure inside a treatment chamber when a resist was formed on a substrate and, then, a first introduction of an ion and a second introduction of an ion were performed. Further, in the Example, a condition of a second acceleration voltage was fluctuated at the time of the second introduction.

FIGS. 2A to 2C show an example in which a resist 21 is partially formed on a substrate 20. In this example, a glass substrate was used as the substrate 20 and a novolac resin was used as the resist 21.

Figure 4A:
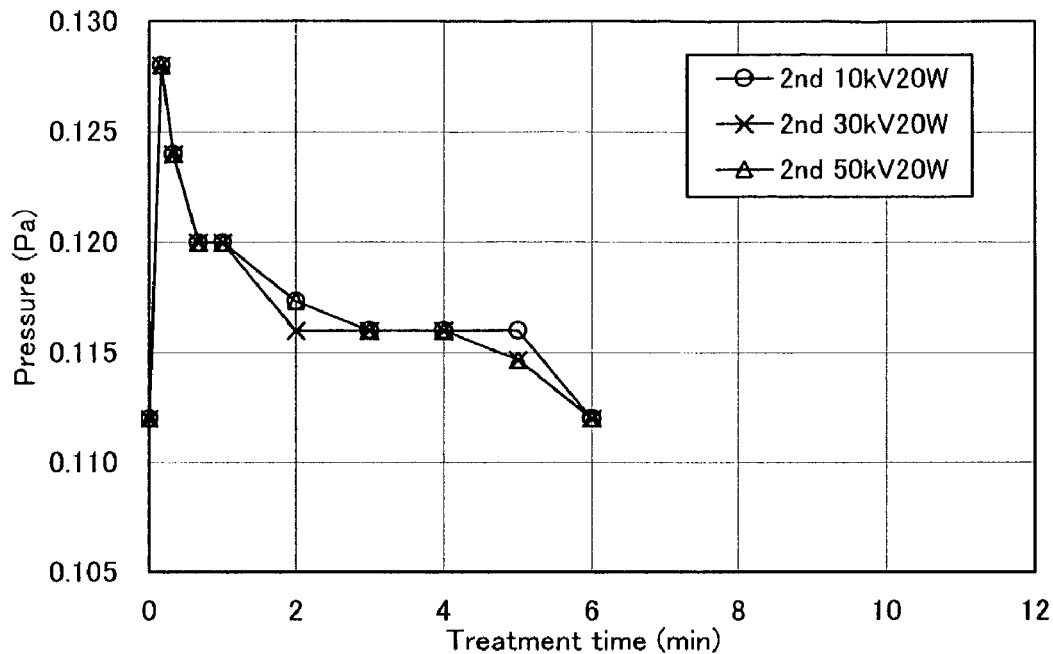
FIGS. 4A and 4B are graphs showing an example of change of pressure in a treatment chamber when a first acceleration voltage is kept under a same condition while fluctuating a second acceleration voltage.

A first introduction of the ion was performed into the substrate on which the resist 21 was thus formed. Such introduction processing was performed for 6 minutes by using an ion doping apparatus and $B_2H_6$ as a material gas. Further, a radio frequency supply of 5 W and an acceleration voltage of 90 kV were adopted. Changes of the pressure inside the treatment chamber under the above-described conditions are shown in FIG. 4A. In each case, the pressure reached a peak value 10 seconds after the first introduction was started and, thereafter, was decreased.

Subsequently, evacuation of the inside of the treatment chamber is conducted to remove the dissociated gas 16 from the treatment chamber or decrease the dissociated gas 16 inside the treatment chamber (see FIG. 2B).

Figure 4B:
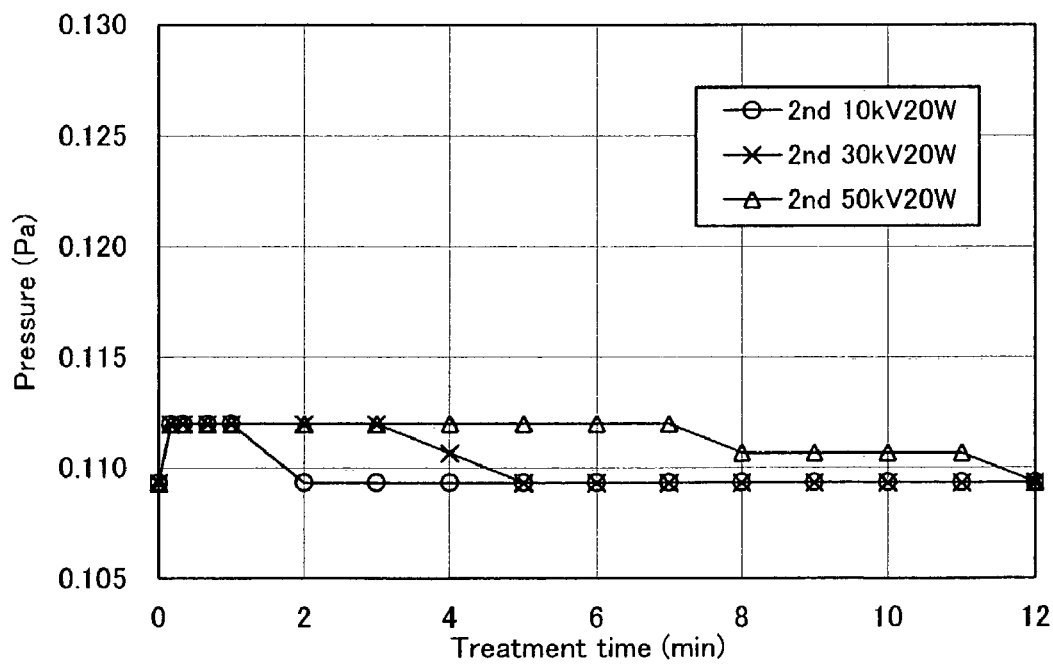

Thereafter, a second introduction of the ion is conducted by a second acceleration voltage on each of the substrates on which the first introduction was performed (see FIG. 2C). Also in such second introduction processing, an ion doping apparatus was used as in the first introduction processing of the ion. As far as the material gas is concerned, $B_2H_6$ was used in a same manner as in the first introduction. The radio frequency supply was allowed to be 20 W and the acceleration voltage was allowed to have 3 conditions of values, that is, 10 kV, 30 kV, and 50 kV. Changes of the pressure inside the treatment chamber at this occasion are shown in FIG. 4B. It can be seen from FIG. 4B that, when the acceleration voltage at the time of the first introduction is high, there is little change of pressure at the time of the second introduction, that is, there is little generation of the dissociated gas.

Under these circumstances, it can be seen, according to the invention, that the first acceleration voltage is desirably higher than the second acceleration voltage. Namely, when the first acceleration voltage is high, the generation of the dissociated gas can be decreased or prevented without depending on the second acceleration voltage; therefore, it becomes possible to perform a highly uniform introduction of the ion. Further, by changing values of the radio frequency supply in the first and second introductions from one to the other, electric current densities at the time of the first and second introductions are differentiated from one to the other. Namely, since the electric current density at the time of the first introduction is lower than that at the time of the second introduction, the first introduction can be performed without introducing the component of the dissociated gas into the semiconductor.

By performing the ion introduction by dividing the introduction processing itself into a plurality of times in the manner as described above, it becomes possible to decrease or prevent the introduction of the component of the dissociated gas into the semiconductor. Further, the processing can be performed without departing from the set introduction conditions and the ion can be introduced into the semiconductor in a uniform manner. Furthermore, since baking processing is not performed on the resist before the ion is introduced, a number of processing steps is not increased and, also, it becomes possible to easily perform a removal of the resist which is to be conducted after the ion is introduced.

In the present Example, although the introduction of the ion was performed while dividing the introduction processing itself by two times, the number of the introduction is not limited to two times so long as it is a plurality of times.

EXAMPLE 4

In the present Example, a method in which the method according to the present invention is applied after baking processing is performed on a resist will be described below.

Figure 5:
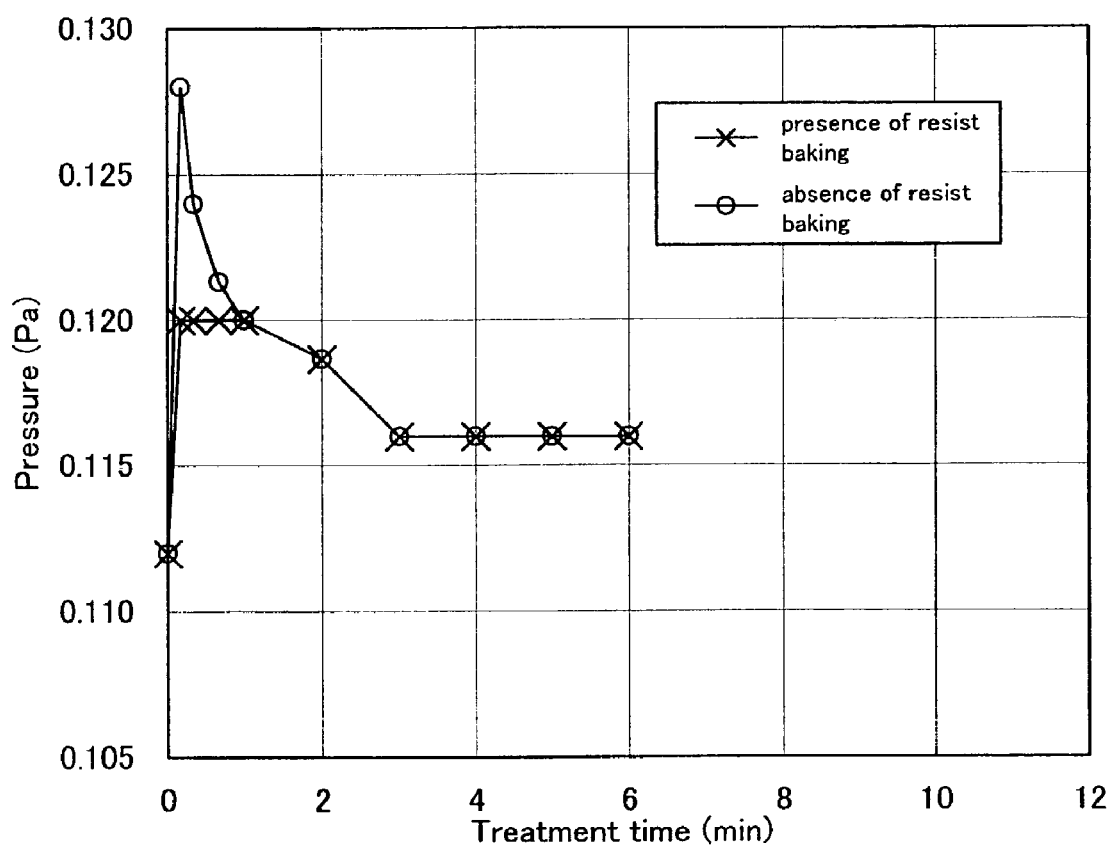
FIG. 5 is a graph showing an example of change of pressure in a treatment chamber in accordance with presence or absence of resist baking.
Figure 6:
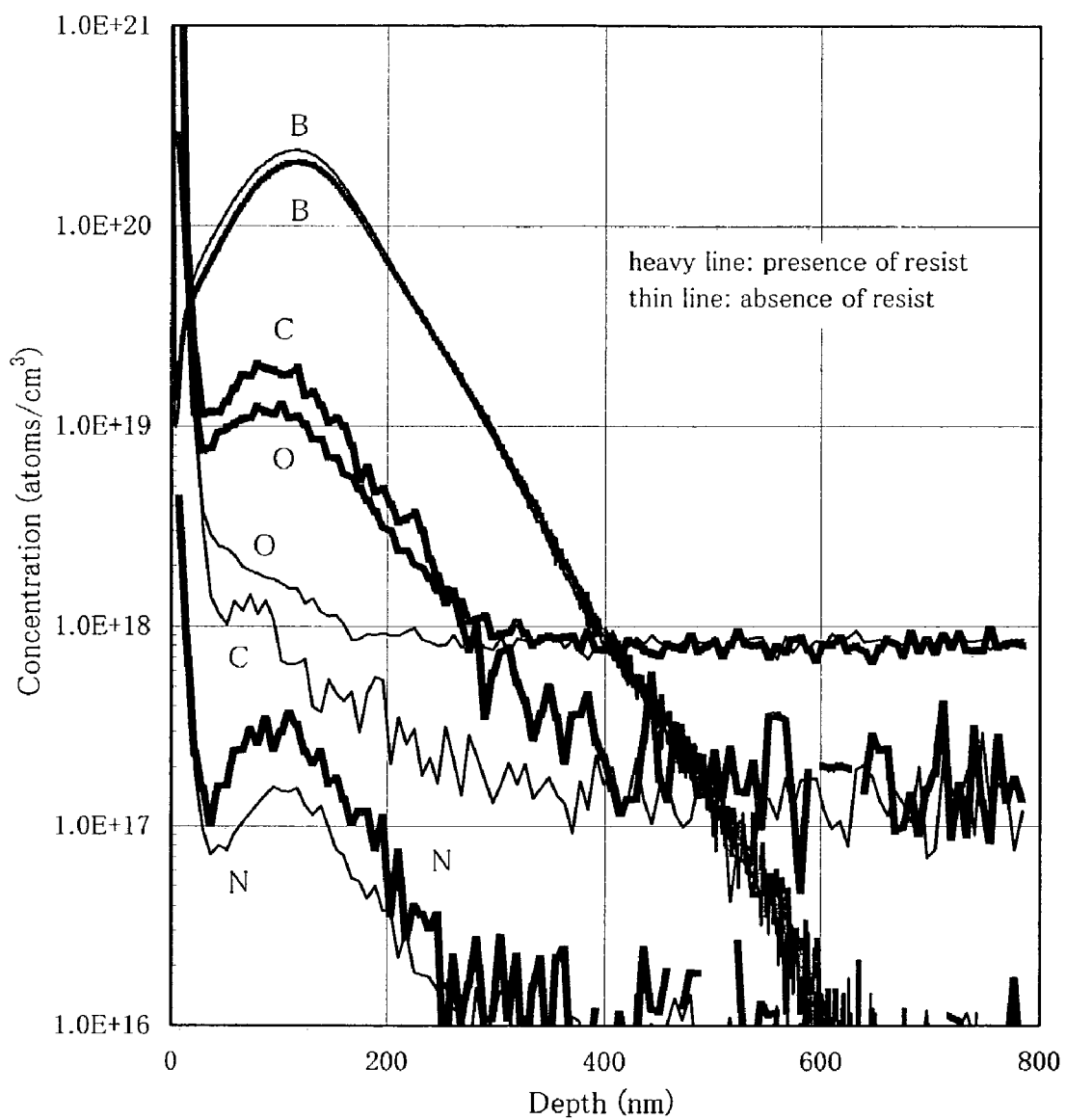
FIG. 6 is a graph showing an example of distributions of ions in a silicon wafer in accordance with presence or absence of a resist.

FIG. 5 shows changes of pressure inside a treatment chamber at the time of an introduction of an ion on each of samples: one being prepared by partially forming a resist on a substrate and, then, performing baking processing on the thus-formed resist and the other one being prepared by partially forming a resist on a substrate and not performing baking processing on the thus-formed resist. A novolac resin was used as the resist and the baking processing was performed in an oven at 200° C. for 2 hours. The ion introduction was performed under the following conditions: an ion-doping apparatus was used; $B_2H_6$ was used as a material gas; a radio frequency supply was 5 W; an acceleration voltage was 80 kV; and a dose rate was $1.5 \times 10^{15}$ atoms/$Cm^2$.

It can be seen from FIG. 5 that the pressure inside the treatment chamber was changed even when the baking processing has been performed, that is, the dissociated gas was generated. For this reason, it is preferable that a component of the dissociated gas is not allowed to be introduced into the semiconductor in accordance with the present Example while applying the method according to the invention.

By performing the ion introduction by dividing the introduction processing itself into a plurality of times in the manner as described above, it becomes possible to decrease or prevent the introduction of a component of the dissociated gas into the semiconductor. Further, the processing can be performed without departing from the set introduction conditions and the ion can be introduced into the semiconductor in a uniform manner.

EXAMPLE 5

A method for manufacturing an active matrix substrate is described in this example using FIGS. 7A to 10. A substrate on which a CMOS circuit, a driver circuit, and a pixel portion having TFT pixels and a storage capacitor are formed together is called active matrix substrate as a matter of convenience.

First, a substrate 400 made from glass such as barium borosilicate glass or aluminum borosilicate glass is used in this example. Note that substrates such as quartz substrates, silicon substrates, metallic substrates, and stainless steel substrates having an insulating film formed on the substrate surface may also be used as the substrate 400. Further, a plastic substrate having heat resisting properties capable of enduring the processing temperatures used in this example may also be used. Further more, a flexible substrate also is applicable.

Next, a base film 401 made from an insulating film such as a silicon oxide film, a silicon nitride film, or a silicon oxynitride film is then formed on the substrate 400 by known methods. A two layers structure is used as the base film 401 in this example, but a single layer of the above-mentioned insulating film may also be used, and a structure in which more than two layers are laminated may also be used.

Next, a semiconductor film is formed on the base film 401. The semiconductor film is formed with a thickness of 25 to 200 nm (preferably 30 to 150 nm) by a known method (such as a sputtering method, LPCVD method and plasma CVD method), and crystallized by a known crystallization method (such as a laser crystallization method, a thermal crystallization method using RTA or a furnace annealing and a thermal crystallization method using a metal element facilitating the crystallization) or crystallized by a combination of the known methods of crystallization. As the semiconductor film, an amorphous semiconductor film, a microcrystalline semiconductor film, and a crystalline semiconductor film may be used, further, a compound semiconductor film having an amorphous structure such as an amorphous silicon germanium film, an amorphous silicon carbide also can be applied therefor. In case where the laser crystallization is applied, it is preferable that a solid-state laser, a gas laser, or a metallic laser of continuous oscillation type or pulse oscillation type is used. Note that, as the solid-state laser, there may be given a YAG laser, a $YVO_4$ laser, a YLF laser, a $YAlO_3$ laser, a glass laser, a ruby laser, an alexandrite laser, a Ti: sapphire laser, and the like of continuous oscillation type or pulse oscillation type. As the gas laser, an excimer laser, an Ar laser, Kr laser, $CO_2$ laser, or the like of continuous oscillation or pulse oscillation may be used. And as the metallic laser, there may be given a helium cadmium laser, a copper vapor laser, or a gold vapor laser.

In this example, the plasma CVD method is used to form an amorphous silicon film with a thickness of 50 nm, and then the thermal crystallization method using metallic elements, which promote crystallization, and laser crystallization method are used for the amorphous silicon film. Nickel is used as a metal element, and is introduced onto the amorphous silicon film by a solution coating method. Then a heat treatment is conducted at 500° C. for five hours, whereby obtaining a first crystalline silicon film. Subsequently, the laser beam shot from a continuous oscillation $YVO_4$ laser with output 10 W is converted into the second higher harmonic wave by a nonlinear optical element and laser irradiating is performed on the first crystalline silicon film to obtain a second crystalline silicon film. Irradiating the laser beam to the first crystalline silicon film, and changing the first crystalline silicon film to the second crystalline silicon film to improve the crystallinity of the second crystalline silicon film. At this moment, about 0.01 to 100 $MW/cm^2$ (preferably 0.1 to 10 $MW/cm^2$) is necessary for the energy density. The stage is relatively moved to the laser beam at a speed of about 0.5 to 2000 cm/s, and it irradiates, and then the crystalline silicon film is formed. However, when the pulse oscillation laser is used, the pulse frequency is set to 300 Hz and the laser energy density is set to 100 to 1500 $mj/cm^2$ (typically 200 to 1200 $mj/cm^2$). The overlap percentage of the linear beams may be 50 to 98%.

Of course, although a TFT can be formed by using the first crystalline silicon film, it is preferable that the second crystalline silicon film is used to form the TFT since the second crystalline silicon film has an improved crystallinity and electric properties of the TFT. For instance, although, when a TFT is formed by using the first crystalline silicon film, the mobility is almost 300 $cm^2/Vs$, when a TFT is formed by using the second crystalline silicon film, the mobility is extremely improved with approximately 500 to 600 $cm^2/Vs$.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 200 nm using the plasma CVD or the sputtering. In this example, a silicon oxynitride film having a film thickness of 110 nm is formed by the plasma CVD method. The gate insulating film is of course not limited to a silicon oxynitride film, and other insulating films containing silicon may be used in a single layer or in a lamination structure.

Further, if a silicon oxide film is used, it can be formed by the plasma CVD method with a mixture of TEOS (Tetraethyl Orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good properties as a gate insulating film can be obtained by subsequently performing thermal annealing, at between 400 and 500° C., of the silicon oxide film thus manufactured.

A first conductive film 408 having a film thickness of 20 to 200 nm, and a second conductive film 409 having a film thickness of 100 to 500 nm are then formed and laminated on the gate insulating film 407. The first conductive film 408, made from a TaN film having a film thickness of 30 nm, and the second conductive film 409, made from a W film having a film thickness of 370 nm, are formed and laminated in this example. The TaN film is formed by the sputtering method, and the sputtering of a Ta target is performed in a nitrogen atmosphere. Further, the W film is formed by the sputtering method using a W target. In addition, the W film can also be formed by the thermal CVD method using tungsten hexafluoride ($WF_6$). Whichever is used, it is necessary to be able to make the film become low resistance in order to use it as a gate electrode, and it is preferable that the resistivity of the W film be made less than 20 μΩcm.

Note that although the first conductive film 408 is TaN and the second conductive film 409 is W in this example, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 7B). An ICP (Inductively Coupled Plasma) etching method is used as a first etching condition in this example. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 7C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

Then, the masks made of resist are removed, a first introduction of ion is performed and impurity elements that impart n-type at a low concentration to the semiconductor layer are introduced. The ion introduction may be performed by an ion doping method or an ion injection method. The ion doping may performed with process conditions in which the dosage is set from $1\times10^{13}$ to $5\times10^{14}$ atoms/cm$^2$, and the acceleration voltage is set between 40 to 80 keV In this example, the ion doping is performed with the dosage set to $1.5\times10^{13}$ atoms/cm$^2$, and the acceleration voltage set to 60 keV. An element belonging to the group 15, typically phosphorous (P) or arsenic (As) is used as an impurity element that imparts n-type. Phosphorous (P) is used here. In this case the conductive layers 428 to 433 act as masks with respect to the impurity element that imparts n-type conductivity, and the impurity regions 423 to 427 are formed in a self-aligning manner. The impurity element that imparts n-type is added to the impurity regions 423 to 427 at a concentration in a range of $1\times10^{18}$ to $1\times10^{20}$ atoms/cm$^3$.

Next, after removing the masks made of resist, new masks 434a to 434c made of resist are formed, a second introduction of ion is performed as processing to remove or decrease generation of dissociated gas. The acceleration voltage is set between 50 to 120 keV as an ion doping condition, and it is preferred to perform the ion introduction less than 6 minutes. The gas used for the second introduction of ion may be a known material gas or an inert gas. Although the dissociated gas is evacuated from the resist by the second introduction of ion, however, components of the dissociated gas are hardly introduced into the semiconductor layer by virtue of the processing in a short time. It is performed in this example with processing conditions in which the acceleration voltage is set to 70 keV, the material gas used is $PH_3$, and the processing time is set for 2 minutes.

After the second introduction of ion is completed, it is preferred to perform evacuation of the inside of a treatment chamber to remove the dissociated gas from the treatment chamber or decrease the dissociated gas inside the treatment chamber.

Next, a third introduction of ion is performed with the masks 434a to 434c being kept in a state as it is. The third introduction of ion is performed with the dosage set to $1\times10^{13}$ to $5\times10^{17}$ atoms/cm$^2$ and the acceleration set between 40 to 120 keV. The second conductive layers 428a, 430a, and 432a are used as masks for the doping processing, and the doping is performed to add a impurity element to the semiconductor layer where is not overlapped with the first conductive layers 428b, 430b, and 432b and the semiconductor layer that locates at the downward in the taper portion of the first conductive layer (FIG. 8B). It is performed in this example with processing conditions in which the acceleration voltage is set to 65 keV, the material gas used is $PH_3$, and the dosage is set to $4\times10^{15}$ atoms/cm$^2$. By the second introduction of ion, the impurity elements which impart n-type within the range of the density of $1\times10^{18}$ to $5\times10^{19}$ atoms/cm$^2$ are added to the low concentration impurity regions 436b, 442b, and 448b overlapping with the first conductive layers, whereas the impurity elements which impart n-type within the range of the density of $1\times10^{19}$ to $5\times10^{21}$ atoms/cm$^2$ are added to the high concentration impurity regions 435b, 441b, 444b and 447b.

Of course, performing the third doping can be divided into two steps, it is practicable to divide and form the low concentration impurity region and the high concentration impurity region in each doping processing.

Next, after removing the masks made of resist, new masks 450a to 450c made of resist are formed and a fourth introduction of ion is performed as processing to decrease or remove generation of dissociated gas. The acceleration voltage is set between 50 to 120 keV as a doping condition, and it is preferred to perform the doping less than 6 minutes. The gas used for the fourth introduction of ion may be a known material gas or an inert gas. Although the dissociated gas is evacuated from the resist by the fourth introduction of ion, however, components of the dissociated gas are hardly introduced into the semiconductor layer by virtue of the processing in a short time. It is performed in this example with processing conditions in which the acceleration voltage is set to 90 keV, the material gas used is $B_2H_6$, and the processing time is set for 1 minute.

After the fourth introduction of ion is completed, it is preferred to perform evacuation of the inside of the treatment chamber to remove the dissociated gas from the treatment chamber or decrease the dissociated gas inside the treatment chamber.

Next, a fifth introduction of ion is performed with the masks 450a to 450c being kept in a state as it is. The fifth introduction of ion is performed with the dosage set to $1\times10^{14}$ to $5\times10^{18}$ atoms/cm$^2$ and the acceleration set between 40 to 120 keV. Impurity regions 453b, 454b, to which an impurity element that imparts a conductivity type opposite to that of the above one conductivity type is added, are formed in accordance with the fifth doping processing in the semiconductor layer which becomes the active layer of the p-channel type TFTs. The first conductive layer 429a is used as a mask with respect to the impurity element, and an impurity element which imparts p-type conductivity is added to form the impurity regions in a self-aligning manner. The impurity regions 453b, 454b are formed by ion doping method using diborane ($B_2H_6$) in this example. At this time the acceleration voltage is set at 80 keV (FIG. 8B). The semiconductor layers for forming the n-channel type TFT are covered with the masks 450a to 450d made of resist when the fifth introduction of ion is performed. Phosphorous is added into the impurity region 424 by the first to third introductions of ion. However, by performing doping processing such that the concentration of the impurity element that imparts p-type conductivity becomes from $1\times10^{19}$ to $5\times10^{21}$ atoms/cm$^3$, no problems develop in making the regions function as source regions and drain regions of the p-channel type TFT.

The impurity regions are thus formed in respective semiconductor layers by the steps up through this point.

A first interlayer insulating film 461 is formed next after removing the masks 450a to 450d made of resist. This first interlayer insulating film 461 is formed from an insulating film containing silicon, having a thickness of 100 to 200 nm, by using a plasma CVD method or a sputtering method. A silicon oxynitride film having a thickness of 150 nm is formed by the plasma CVD method in this example. The first interlayer insulating film 461 is of course not limited to a silicon oxynitride film, and other insulating films containing silicon may also be used, as a single layer or a lamination structure.

Subsequently, a recovery of the crystallinity of the semiconductor layer and an activation of the impurity elements added to the respective semiconductor layers are performed by irradiating the laser beam. It is preferable that a laser of a continuous oscillation type or a pulse oscillation type such as a solid-state laser, a gas laser, or metallic laser is used. At this moment, if a continuous oscillation laser is used, approximately 0.01 to 100 MW/cm$^2$ (preferably 0.1 to 10 MW/cm$^2$) is necessary for the approximately 0.01 to 100 MW/cm$^2$ (preferably 0.1 to 10 MW/cm$^2$) is necessary for the energy density of laser beam. The substrate is relatively moved to the laser beam at a speed of approximately 0.5 to 2000 cm/s. And, if a pulse oscillation laser is used, it is preferable that 300 Hz of frequency and 50 to 1000 mj/cm$^2$ (typically, 50 to 700 mj/cm$^2$) of laser energy density are used. At this moment, laser beam may be overlapped by 50 to 98%. Besides laser annealing method, thermal annealing method or rapid thermal annealing method (RTA method) and the like can be applied.

Further, the activation may also be performed before the formation of a first interlayer insulating film 461. However, if the wiring material used is weak with respect to heat, then it is preferable to perform the activation processing after forming an interlayer insulating film (an insulating film having silicon as its main constituent, for example a silicon nitride film) in order to protect the wirings and the like, as in this example.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment for 1 to 12 hours at a temperature of 300 to 450° C. in an atmosphere containing hydrogen of from 3 to 100% may also be performed as other means of hydrogenation.

Subsequently, a second interlayer insulating film 462 made from an inorganic insulating film material or from an organic insulating material is formed on the first interlayer insulating film 461. An acrylic resin film having a film thickness of 1.6 μm is formed in this example, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film that forms an uneven surface in this example. Further, the pixel electrode surface can be made to be uneven and have region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film that covers the convex portion.

A film having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Wirings 463 to 467 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, it is not limited to the two-layer structure, the single-layer structure or the lamination structure more than three layers may also be acceptable. Further, wiring materials are not limited to Al and Ti. For example, Al and Cu are formed on TaN film, and the lamination film forming the Ti film is formed by the patterning and form wiring (FIG. 9C).

Further, a pixel electrode 470, a gate wiring 469, and a connection electrode 468 are formed in a pixel portion 507. An electrical connection is formed with the pixel TFT and the source wiring (a lamination layer of 433*a* and 433*b*) by the connection electrode 468. Further, the gate wiring 469 forms an electrical connection with the gate electrode of the pixel TFT. The pixel electrode 470 forms an electrical connection with the drain region of the pixel TFT, and in addition, forms an electrical connection with the semiconductor layer 406 that functions as one electrode forming a storage capacitor. It is preferable to use a material having superior reflectivity, such as a film having Al or Ag as its main constituent, or a lamination film of such films, as the pixel electrode 470.

A CMOS circuit composed of an n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; a low concentration impurity region 436*b* (GOLD region) which overlaps with the first conductive layer 428*a* that structures a portion of the gate electrode; and a high concentration impurity region 435*b* which functions as a source region or a drain region. The p-channel TFT 502, which forms the CMOS circuit with the n-channel TFT 501 and the electrode 466 by an electrical connection has: a channel forming region 455; a high concentration impurity region 453*b* functioning as a source region or a drain region, a impurity region 454*b* to which impurity elements imparting n-type and impurity elements imparting p-type are added. Further, the n-channel TFT 503 has: a channel forming region 443; a low concentration impurity region 442*b* (GOLD region) which overlaps with the first conductive layer 430*a* that structures a portion of the gate electrode; and a high concentration impurity region 441*b* which functions as a source region or a drain region.

The pixel TFT 504 of the pixel portion has: a channel forming region 446; a low concentration impurity region 445*b* (LDD region) formed on the outside of the gate electrode; and a high concentration impurity region 444*b* which functions as a source region or a drain region. Further, an impurity element that imparts n-type and an impurity element, which imparts p-type, are added to the semiconductor layer which functions as one electrode of the storage capacitor 505. The storage capacitor 505 comprises an electrode (lamination of 432*a* and 432*b*) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this example.

Figure 10:
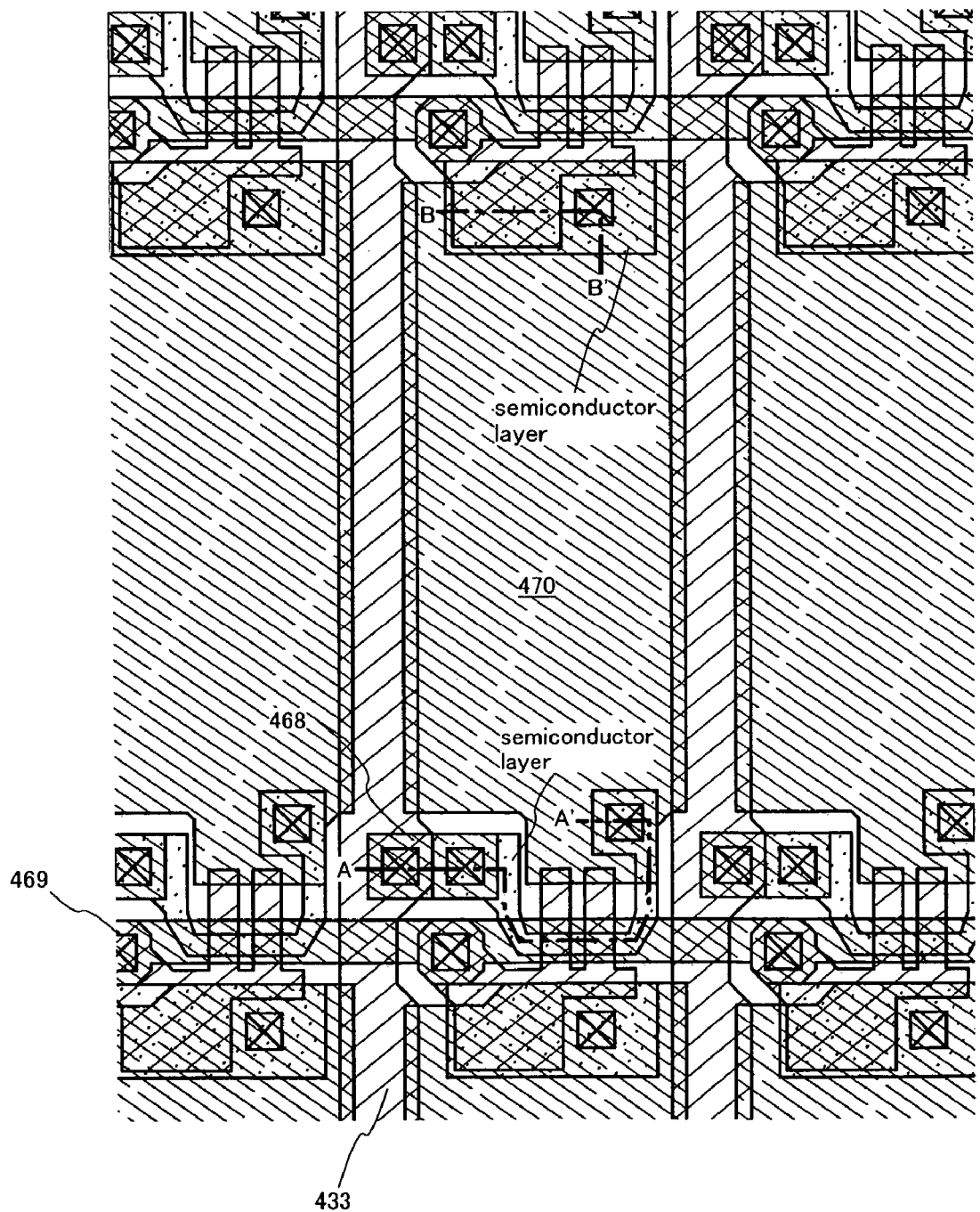
FIG. 10 is a top view of a configuration of a pixel TFT.

A top view of the pixel portion of the active matrix substrate manufactured in this example is shown in FIG. 10. Note that the same reference symbols are used for portions corresponding to those in FIGS. 7A to 10. A chain line A-A' in FIG. 9C corresponds to a cross sectional diagram cut along a chain line A-A' within FIG. 10. Further, a chain line B-B' in FIG. 9C corresponds to a cross sectional diagram cut along a chain line B-B' within FIG. 10.

An active matrix substrate manufactured according to the above method has TFTs manufactured by using a semiconductor film having superior properties by virtue of little introduction of components of the dissociated gas from the ion introduction and being easy for removing resist after the ion introduction, thereby the electric properties of the TFTs become sufficient ones. Consequently, by using such TFTs, a semiconductor device having sufficient operation properties and reliability can be manufactured.

EXAMPLE 6

Figure 11:
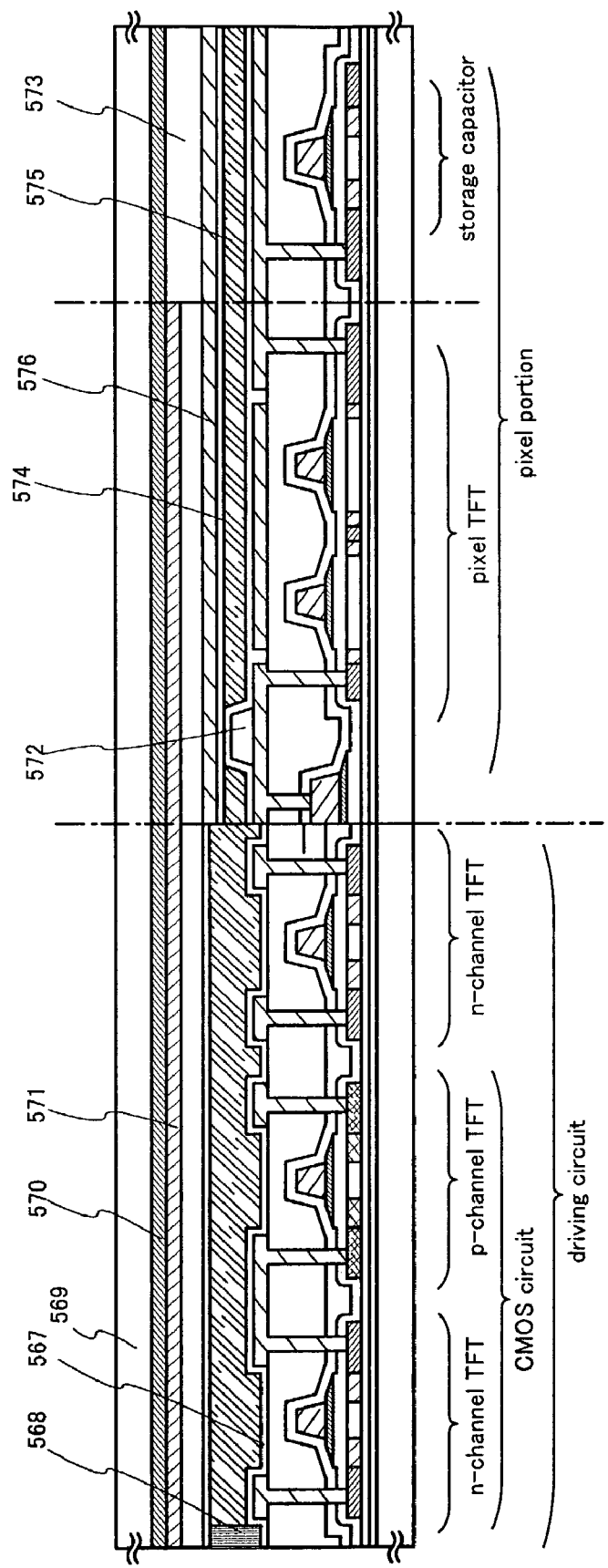
FIG. 11 is a cross-sectional view of an active matrix-type crystal display device.

A process of manufacturing a reflection type liquid crystal display device from the active matrix substrate manufactured in Example 5 is explained below in this example using FIG. 11. Although there is no description of the invention in this example, since the active matrix substrate manufactured in Example 5 is used, it can be said that the invention is applied.

An active matrix substrate in the state of FIG. 9 is first obtained in accordance with Example 5, an orientation film 567 is then formed on at least the pixel electrode 470 on the active matrix substrate of FIG. 9, and a rubbing processing is performed. Note that, before forming the orientation film 567 in this example, columnar spacer 572 is formed in desired positions by patterning an organic resin film, such as an acrylic resin film and the like, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Example 5 is used in this example. Therefore, with the top view of the pixel portion of Example 5 shown in FIG. 10, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask and the like.

An opposing electrode 576 made from a transparent conductive film is formed on the leveling film 573 over at least the pixel portion, an orientation film 574 is formed over the entire surface of the opposing substrate, and a rubbing processing is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 11 is thus completed. The active matrix substrate or the opposing substrate is then cut into a desired shape if necessary. In addition, a polarizing plate (not shown in the figure) is attached to only the opposing substrate. An FPC is then attached using a known technique.

A liquid crystal display device made by above-mentioned method has TFTs manufactured by using a semiconductor film having superior properties by virtue of little introduction of components of the dissociated gas from the ion introduction and being easy for removing resist after the ion introduction. Thus, it is possible to become the one with enough operation properties and reliability of the above-mentioned liquid crystal display device. Such a liquid crystal display can be used as a display portion in various kinds of electronic apparatus.

EXAMPLE 7

In this example, an example of manufacturing the light emitting device by using a manufacturing method of a TFT that is used for forming an active matrix substrate as shown in Example 5 will be described. Although there is no description of the invention in this example, since the active matrix substrate manufactured in Example 5 is used, it can be said that the invention is applied. In this specification, the light emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a light emitting layer), an anode, and a cathode. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In this specification, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the hole transportation layer, and the cathode layer etc. are sequentially laminated.

Figure 12:
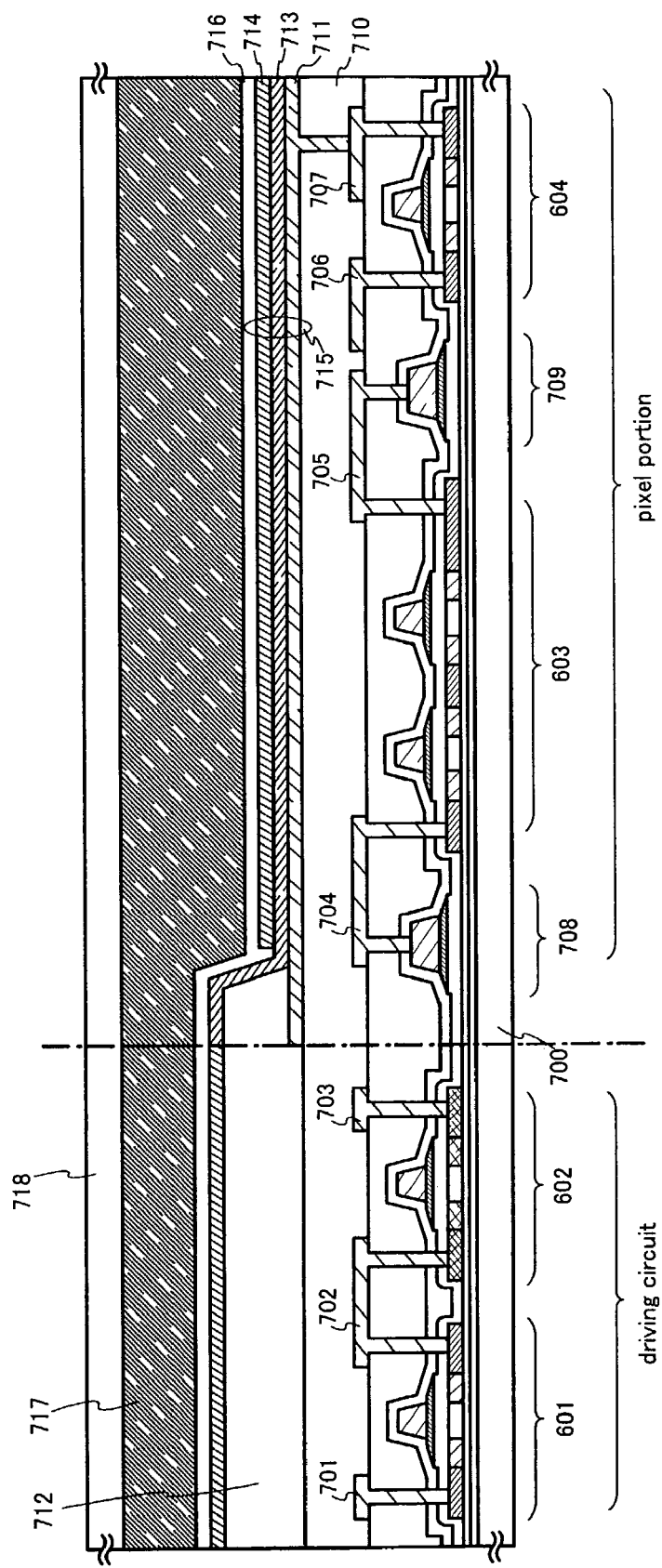
FIG. 12 is a cross-sectional constitutional view of a drive circuit and a pixel portion of a light emitting device.

FIG. 12 is a sectional view of a light emitting device of this example. In FIG. 12, the switching TFT 603 provided on the substrate 700 is formed by using the n-channel TFT 503 of FIG. 9C. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 9C. Consequently, concerning the explanation of the structure, it is satisfactory to refer the explanation on the n-channel TFT 601 and p-channel TFT 602. Incidentally, although this example is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 9C. Consequently, concerning the explanation of the structure, it is satisfactory to refer to the explanation on the p-channel TFT 502. Incidentally, although this example is of a single gate structure, it is possible to use a double gate structure or a triple gate structure.

Meanwhile, the wiring 706 is a source wiring of the current control TFT (corresponding to a current supply line) while the wiring 707 is a current control electrode to be electrically connected to the pixel electrode 711.

Meanwhile, reference numeral 711 is a pixel electrode (an anode of a light-emitting element) formed by a transparent conductive film. A compound of indium oxide and tin oxide, a compound of indium oxide and zinc oxide, zinc oxide, tin oxide or indium oxide, or otherwise a transparent conductive film as above added with gallium may be used as the transparent conductive film. The pixel electrode 711 is formed on a planar interlayer insulating film 710 prior to forming the wirings. In this example, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 12. The bank 712 may be formed by patterning an insulating film or organic resin film containing silicon having 100 to 400 nm.

Incidentally, because the bank 712 is an insulating film, caution must be paid to element electrostatic breakdown during deposition. In this example added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ $\Omega$m (preferably $1 \times 10^8$ to $1 \times 10^{10}$ $\Omega$m).

A light emitting layer 713 is formed on the pixel electrode 711. Incidentally, although FIG. 12 shows only one pixel, this example separately forms the light-emitting layer correspondingly to the respective colors of R (red), G (green) and B (blue). Meanwhile, in this example is formed a low molecular weight organic light emitting material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic light emitting material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this example was shown the example in which a low molecular weight organic light emitting material is used for a light-emitting layer, it is possible to use an intermediate organic light emitting material and a high molecular weight organic light emitting material. Furthermore, an intermediate molecular weight organic light-emitting material can be defined that an aggregate of an organic compound which does not have subliming property or dissolving property (preferably, an aggregate which has molecularity of 10 or less), or an organic compound which has a molecular chain length of 5 μm of less (preferably 50 nm or less). For an example of using the high molecular weight organic light emitting material, a polythiophene (PEDOT) film with a thickness of 20 nm is formed by the spin coating method as a hole injection layer and the lamination structure installing paraphenylenvinylene (PPV) of approximately 100 nm on it as a light emitting layer may be good. The luminescence wave length can be selected from red to blue by using the $\pi$-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light-emitting layer 713. In this example, as the conductive film used is an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light-emitting layer 713 low in heat resistance. Meanwhile, the DLC film, having a high blocking effect to oxygen, can suppress the light-emitting layer 713 from oxidizing. Consequently, the problem of oxidation can be prevented in the light-emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this example, for the cover member 718 used is a glass substrate, quartz substrate, a plastic substrate (including a plastic film) or a flexible substrate having carbon films (preferably diamond-like carbon films) formed on the both surfaces thereof. In addition to the carbon film, the is aluminum film (such as AlON, AlN, and AlO), SiN and the like are used.

Thus, completed is a light emitting device having a structure as shown in FIG. 12. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, p-channel TFTs 602, a switching TFT (n-channel TFT) 603 and a current control TFT (p-channel TFT) 604 are formed on the substrate 700.

Furthermore, as was explained using FIG. 12, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this example shows only the configuration of the pixel portion and driver circuit. However, according to the manufacturing process in this example, besides these, it is possible to form on the same insulating member such logic circuits as a signal division circuit, a D/A converter, an operation amplifier, a γ-correction circuit or the like. Furthermore, a memory or microprocessor can be formed.

Light emitting display devices made by above-mentioned method has TFTs manufactured by using a semiconductor film having superior properties by virtue of little introduction of components of the dissociated gas from the ion introduction and being easy for removing resist after the ion introduction. Thus, it is possible to become the one with enough operation properties and reliability of the above-mentioned light emitting display devices. Such light emitting display devices can be used as a display portion in various kinds of electronic apparatus.

EXAMPLE 8

Various semiconductor devices (active matrix type liquid crystal display device, active matrix type light emitting device or active matrix type EC display device) can be formed by applying the present invention. Specifically, the present invention can be embodied in electronic apparatus of any type in which such an electro-optical device is incorporated in a display portion. In addition, although there is no description of the invention in this example, since the electric apparatus is manufactured by combining Examples 1 to 6 and 7, it can be said that the invention is applied.

Such electronic apparatus is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 13A to 13F, 14A to 14D, and 15A to 15C show some of its examples.

Figure 13A:
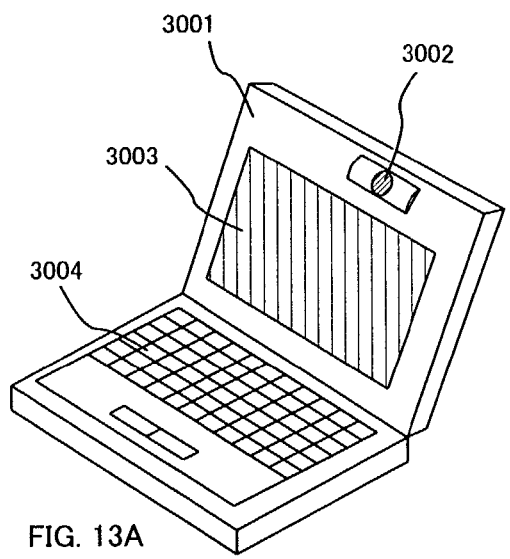
FIGS. 13A to 13F are schematic diagrams showing examples of semiconductor devices.

FIG. 13A shows a personal computer which includes a main body 3001, an image input portion 3002, a display portion 3003, a keyboard 3004 and the like. The personal computer of the present invention can be completed by applying the semiconductor device manufactured by the present invention to the display portion 3003.

Figure 13B:
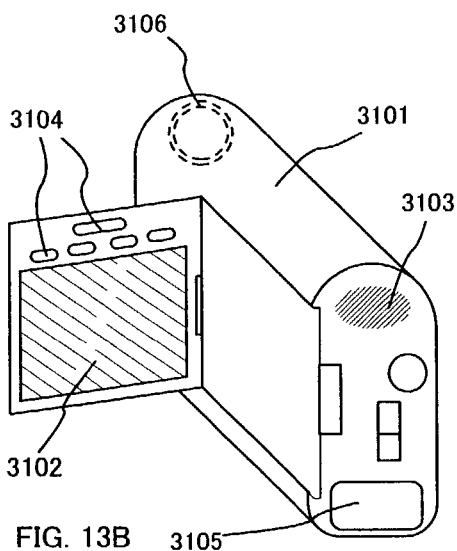

FIG. 13B shows a video camera which includes a main body 3101, a display portion 3102, a sound input portion 3103, operating switches 3104, a battery 3105, an image receiving portion 3106 and the like. The video camera of the present invention can be completed by applying the semiconductor device manufactured by the present invention to the display portion 3102.

Figure 13C:
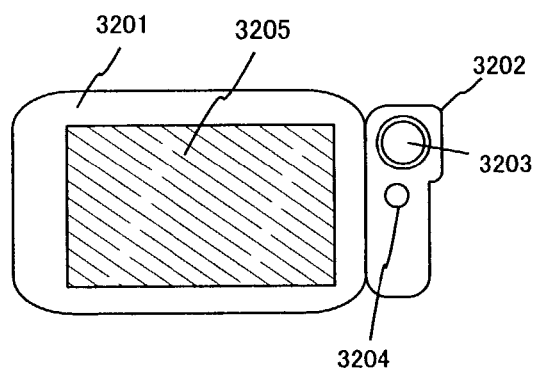

FIG. 13C shows a mobile computer which includes a main body 3201, a camera portion 3202, an image receiving portion 3203, an operating switch 3204, a display portion 3205 and the like. The mobile computer of the present invention can be completed by applying the semiconductor device manufactured by the present invention to the display portion 3205.

Figure 13D:
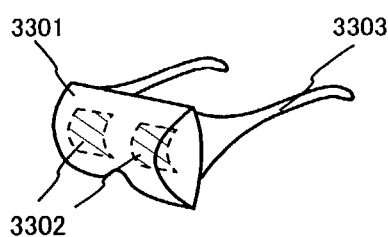

FIG. 13D shows a goggle type display which includes a main body 3301, a display portion 3302, arm portions 3303 and the like. The goggle type display of the present invention can be completed by applying the semiconductor device manufactured by the present invention to the display portion 3302.

Figure 13E:
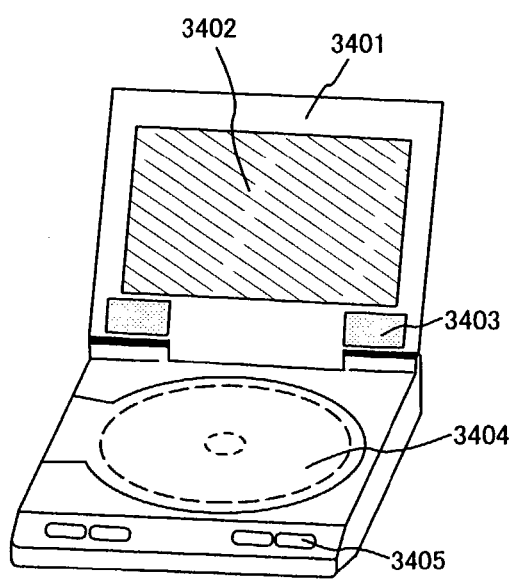

FIG. 13E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention can be completed by applying the semiconductor device manufactured by the present invention to the display portion 3402.

Figure 13F:
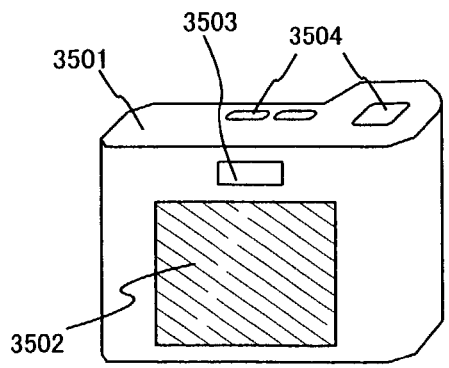

FIG. 13F shows a digital camera which includes a body 3501, a display portion 3502, an eyepiece portion 3503, operating switches 3504, an image receiving portion (not shown) and the like. The digital camera of the present invention can be completed by applying the semiconductor device manufactured by the present invention to the display portion 3502.

Figure 14A:
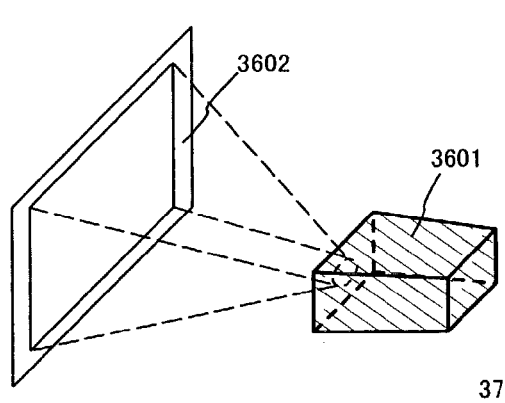
FIGS. 14A to 14D are schematic diagrams showing other examples of semiconductor devices.

FIG. 14A shows a front type projector that includes a projection device 3601, a screen 3602 and the like. The front type projector can be completed by applying the semiconductor device manufactured by the present invention to not only a liquid crystal display device 3808 that constitutes a part of the projection device 3601 but also other driver circuits.

Figure 14B:
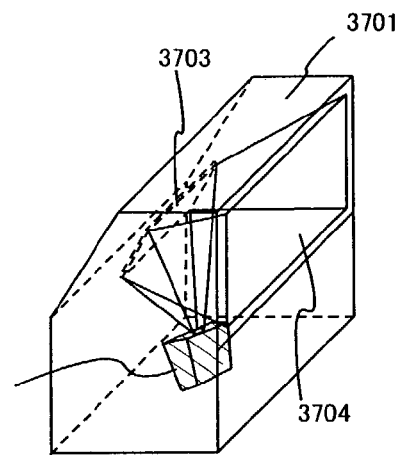

FIG. 14B shows a rear type projector which includes a main body 3701, a projection device 3702, a mirror 3703, a screen 3704 and the like. The rear type projector can be completed by applying the semiconductor device manufactured by the present invention to not only the liquid crystal display device 3808 that constitutes a part of the projection device 3702 but also other driver circuits.

Figure 14C:
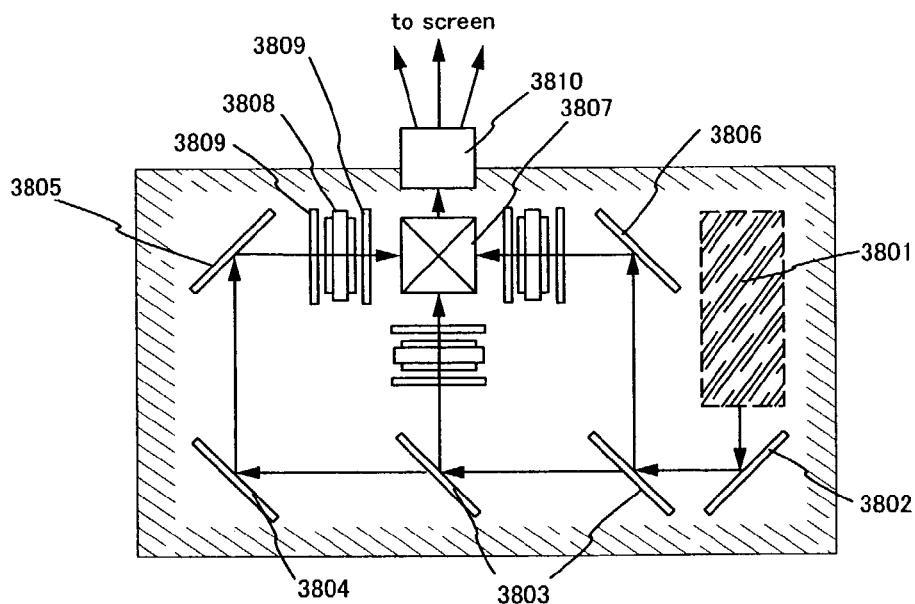

FIG. 14C shows one example of the structure of each of the projection devices 3601 and 3702 which are respectively shown in FIGS. 14A and 14B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Present example is an example of a three-plate type, but it is not limited to this example and may also be of a single-plate type. In addition, those who embody the invention may appropriately dispose an optical system such as an optical lens, a film having a polarization function, a film for adjusting phase difference, an IR film or the like in the path indicated by arrows in FIG. 14C.

Figure 14D:
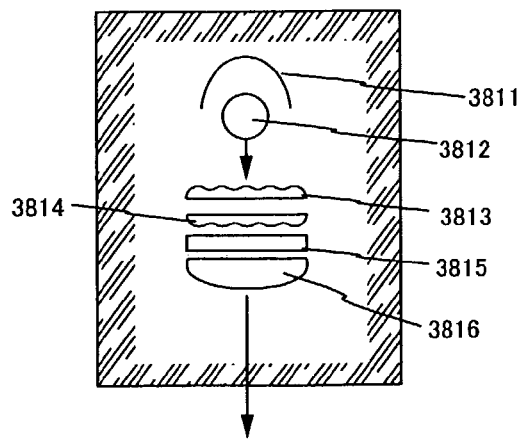

FIG. 14D is a view showing one example of the structure of the light source optical system 3801 shown in FIG. 14C. In this example, the light source optical system 3801 is made of a reflector 3811, a light source 3812, lens arrays 3813 and 3814, a polarizing conversion element 3815 and a condenser lens 3816. Incidentally, the light source optical system shown in FIG. 14D is one example, and the invention is not particularly limited to the shown construction. For example, those who embody the invention may appropriately dispose an optical system such as an optical lens, a film having a polarization function, a film for adjusting phase difference, an IR film or the like.

The projector shown in FIGS. 14A to 14D is of the type using a transparent type of electro-optical device, but there is not shown an example in which the invention is applied to a reflection type of electro-optical device and a light emitting device.

Figure 15A:
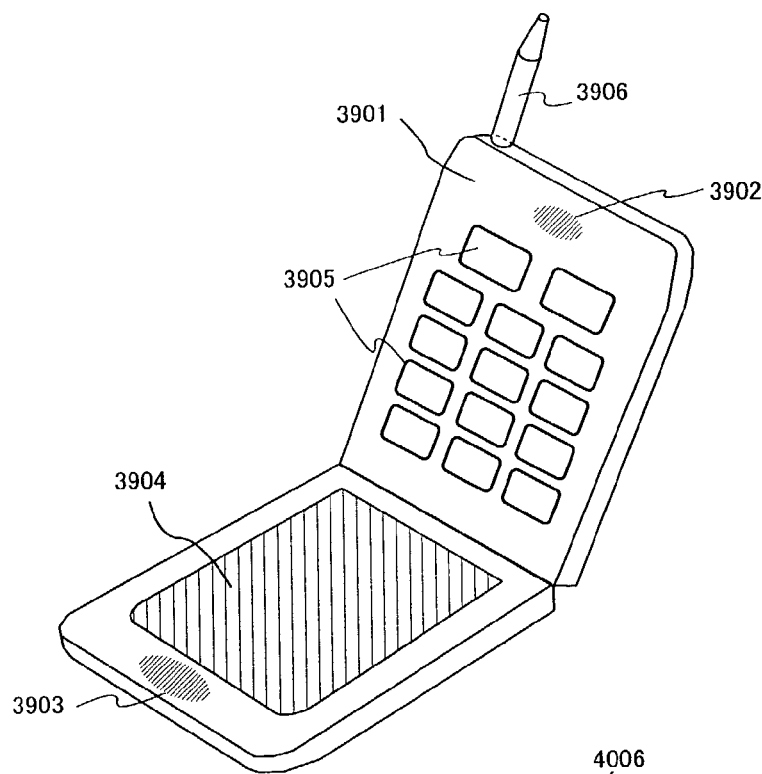
FIGS. 15A to 15C are schematic diagrams showing still other examples of semiconductor devices.

FIG. 15A shows a mobile telephone which includes a main body 3901, a sound output portion 3902, a sound input portion 3903, a display portion 3904, operating switches 3905, an antenna 3906 and the like. The mobile telephone of the present invention can be completed by applying the semiconductor device manufactured by the present invention to the display portion 3904.

Figure 15B:
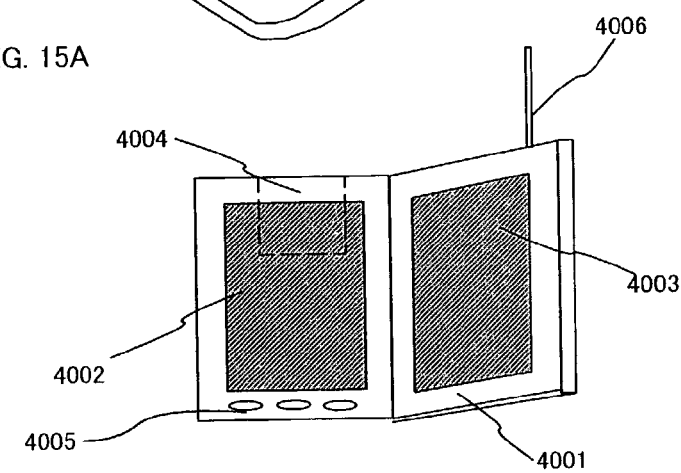

FIG. 15B shows a mobile book (electronic book) which includes a main body 4001, display portions 4002 and 4003, a storage medium 4004, operating switches 4005, an antenna 4006 and the like. The mobile book of the present invention can be completed by applying the semiconductor device manufactured by the present invention to the display portions 4002 and 4003.

Figure 15C:
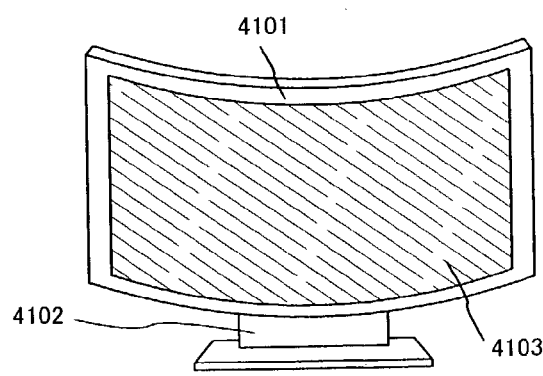

FIG. 15C shows a display which includes a main body 4101, a support base 4102, a display portion 4103 and the like. The display of the present invention can be completed by applying the semiconductor device manufactured by the present invention to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Examples 1 to 6 and 7.

By adopting the above-described aspects of the present invention, the following basic significances can be obtained:
 (a) Even when an ion introduction processing is performed by using an organic film, a dissociation gas is prevented from being generated from the organic film;
 (b) An adverse effect to be caused by the dissociated gas to be generated from the organic film can be prevented from being given to a process;
 (c) In a semiconductor device which, while satisfying the above-described advantages, is represented by an active matrix-type liquid crystal display device, enhancements of operational characteristics and reliability of the semiconductor device can be achieved.

What is claimed is:

1. A method of manufacturing a semiconductor device comprising:
    forming a first insulating film over a substrate;
    forming a semiconductor film over the first insulating film;
    forming a second insulating film over the semiconductor film;
    forming a mask comprising an organic film over the second insulating film;
    baking the organic film;
    generating a dissociated gas from the baked organic film by introducing ions imparting n-type with a first acceleration voltage and a first current density;
    evacuating a gas dissociated from the mask after introducing the ions; and
    forming an impurity region by introducing the ions imparting n-type into the semiconductor film with a second acceleration voltage and a second current density after evacuating the dissociated gas,
    wherein the first acceleration voltage is higher than the second acceleration voltage,
    wherein the first current density is lower than the second current density, and
    wherein the step of introducing the ions is conducted by on-doping or ion implantation.

2. A method of manufacturing a semiconductor device comprising:
    forming a semiconductor island over a substrate;
    forming a mask comprising an organic material over a first portion of the semiconductor island;
    introducing first ions into the mask with a first acceleration voltage and a first current density;
    evacuating a gas dissociated from the mask after introducing the first ions; and
    introducing second ions into a second portion of the semiconductor island in accordance with the mask with a second acceleration voltage and a second current density after evacuating the gas,
    wherein the first acceleration voltage is higher than the second acceleration voltage,
    wherein the first current density is lower than the second current density, and
    wherein the first ions and the second ions are generated by using a material gas comprising an element selected from the group consisting of phosphorus. arsenic and boron.
    wherein the steps of introducing the ions are conducted by ion-doping or ion implantation.

3. A method of manufacturing a semiconductor device comprising:
    forming a semiconductor island over a substrate;
    forming a gate electrode over a first portion of the semiconductor island;
    introducing first ions into a second portion of the semiconductor island in accordance with the gate electrode;
    forming a mask comprising an organic material over the gate electrode and a portion of the second portion of the semiconductor island;
    introducing second ions into the mask with a first acceleration voltage and a first current density;
    evacuating a gas dissociated from the mask after introducing the second ions;
    introducing third ions into a third portion of the semiconductor island in accordance with the mask with a second acceleration voltage and a second current density after evacuating the gas;
    removing the mask after introducing the third ions;
    forming a first insulating film over the gate electrode and the semiconductor island after removing the mask;
    forming a second insulating film over the first insulating film; and
    forming a pixel electrode over the second insulating film, the pixel electrode being electrically connected with the third portion of the semiconductor island,
    wherein the first acceleration voltage is higher than the second acceleration voltage,
    wherein the first current density is lower than the second current density, and
    wherein the second ions and the third ions are generated by using a material gas comprising an element selected from the group consisting of phosphorus, arsenic and boron, wherein the steps of introducing the ions are conducted by ion-doping or ion implantation.

4. A method of manufacturing a semiconductor device comprising:
forming a first insulating film over a substrate;
forming a semiconductor film over the first insulating film;
forming a second insulating film over the semiconductor film;
forming a mask comprising an organic film over the second insulating film;
baking the organic film;
generating a dissociated gas from the baked organic film by introducing ions imparting p-type with a first acceleration voltage and a first current density;
evacuating a gas dissociated from the mask after introducing the ions; and
forming an impurity region by introducing the ions imparting p-type into the semiconductor film with a second acceleration voltage and a second current density after evacuating the dissociated gas,
wherein the first acceleration voltage is higher than the second acceleration voltage,
wherein the first current density is lower than the second current density, and
wherein the step of introducing the ions is conducted by ion-doping or ion implantation.

* * * * *